(12) United States Patent
Shibazaki

(10) Patent No.: US 8,269,945 B2
(45) Date of Patent: Sep. 18, 2012

(54) MOVABLE BODY DRIVE METHOD AND APPARATUS, EXPOSURE METHOD AND APPARATUS, PATTERN FORMATION METHOD AND APPARATUS, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 847 days.

(21) Appl. No.: 12/343,751

(22) Filed: Dec. 24, 2008

(65) Prior Publication Data

US 2009/0190104 A1    Jul. 30, 2009

Related U.S. Application Data

(60) Provisional application No. 61/006,817, filed on Jan. 31, 2008.

(30) Foreign Application Priority Data

Dec. 28, 2007    (JP) .................................. 2007-340537

(51) Int. Cl.
G03B 27/52    (2006.01)
G03B 27/42    (2006.01)

(52) U.S. Cl. ........................................... 355/30; 355/53
(58) Field of Classification Search .................. 355/30, 355/53, 72, 75
See application file for complete search history.

(56) References Cited

U.S. PATENT DOCUMENTS

| | | | |
|---|---|---|---|
| 5,198,873 A | 3/1993 | Ishizuka et al. | |
| 5,448,332 A | 9/1995 | Sakakibara et al. | |
| 5,602,644 A | 2/1997 | Ota | |
| 5,610,715 A | 3/1997 | Yoshii et al. | |
| 5,969,441 A | 10/1999 | Loopstra et al. | |
| 6,208,407 B1 | 3/2001 | Loopstra | |
| 6,590,634 B1 | 7/2003 | Nishi et al. | |
| 6,611,316 B2 | 8/2003 | Sewell | |
| 6,778,257 B2 | 8/2004 | Bleeker et al. | |
| 6,952,253 B2 | 10/2005 | Lof et al. | |
| 7,023,610 B2 | 4/2006 | Ohtsuki et al. | |
| 7,161,659 B2 | 1/2007 | Van Den Brink et al. | |
| 7,333,174 B2 | 2/2008 | Koenen et al. | |
| 2001/0015799 A1* | 8/2001 | Asano et al. | 355/72 |
| 2003/0025890 A1 | 2/2003 | Nishinaga | |

(Continued)

FOREIGN PATENT DOCUMENTS

EP    1 420 298 A2    5/2004

(Continued)

OTHER PUBLICATIONS

Office Action issued in Chinese Patent Application No. 200880019632.5 dated Jun. 2, 2011 (with translation).

(Continued)

*Primary Examiner* — Hung Henry Nguyen
*Assistant Examiner* — Steven H Whitesell Gordon
(74) *Attorney, Agent, or Firm* — Oliff & Berridge, PLC

(57) ABSTRACT

Encoder heads and Z heads are installed in order to measure the position of a stage that moves within a predetermined plane. Measurement beams emitted from these heads are irradiated to scales arranged on the upper surface of the stage. During the idling, for example, the stage continues to be moved by driving and rotating the stage around the stop position of the stage serving as the center, or the stage is withdrawn to an area to which the measurement beams are not irradiated.

48 Claims, 14 Drawing Sheets

U.S. PATENT DOCUMENTS

| | | | |
|---|---|---|---|
| 2003/0090668 A1* | 5/2003 | Naya et al. | 356/445 |
| 2006/0023178 A1* | 2/2006 | Loopstra et al. | 355/53 |
| 2006/0139660 A1 | 6/2006 | Kwan | |
| 2006/0227309 A1 | 10/2006 | Loopstra et al. | |
| 2007/0052976 A1 | 3/2007 | Pril et al. | |
| 2007/0127006 A1 | 6/2007 | Shibazaki | |
| 2007/0127066 A1 | 6/2007 | Haba | |
| 2007/0195296 A1 | 8/2007 | Van Der Pasch et al. | |
| 2007/0263191 A1 | 11/2007 | Shibazaki | |
| 2007/0263197 A1 | 11/2007 | Luttikhuis et al. | |
| 2007/0268484 A1* | 11/2007 | Matsui | 356/237.3 |
| 2007/0288121 A1 | 12/2007 | Shibazaki | |
| 2008/0043212 A1 | 2/2008 | Shibazaki | |
| 2008/0088843 A1 | 4/2008 | Shibazaki | |
| 2008/0094592 A1 | 4/2008 | Shibazaki | |
| 2008/0094593 A1 | 4/2008 | Shibazaki | |
| 2008/0094604 A1 | 4/2008 | Shibazaki | |
| 2008/0106722 A1 | 5/2008 | Shibazaki | |
| 2008/0218713 A1 | 9/2008 | Shibazaki | |
| 2008/0291413 A1 | 11/2008 | Steijaert et al. | |
| 2009/0135388 A1 | 5/2009 | Makinouchi et al. | |

FOREIGN PATENT DOCUMENTS

| | | |
|---|---|---|
| JP | A-63-131008 | 6/1988 |
| JP | A-02-110319 | 4/1990 |
| JP | A-08-124835 | 5/1996 |
| JP | A-2004-289126 | 10/2004 |
| JP | A-2007-274881 | 10/2007 |
| JP | A-2008-294443 | 12/2008 |
| WO | WO 99/49504 | 9/1999 |
| WO | WO 2004/055803 A1 | 7/2004 |
| WO | WO 2005/074014 A1 | 8/2005 |
| WO | WO 2007/097379 A1 | 8/2007 |
| WO | WO 2007/142351 A1 | 12/2007 |

OTHER PUBLICATIONS

Written Opinion issued in International Patent Application No. PCT/JP2008/003960 dated Apr. 7, 2009 (with translation).

* cited by examiner

MOVABLE BODY DRIVE METHOD AND APPARATUS, EXPOSURE METHOD AND APPARATUS, PATTERN FORMATION METHOD AND APPARATUS, AND DEVICE MANUFACTURING METHOD

CROSS-REFERENCE TO RELATED APPLICATIONS

This non-provisional application claims the benefit of Provisional Application No. 61/006,817 filed Jan. 31, 2008, the disclosure of which is hereby incorporated herein by reference in its entirety.

BACKGROUND OF THE INVENTION

1. Field of the Invention

The present invention relates to movable body methods and apparatuses, exposure methods and apparatuses, pattern formation methods and apparatuses, and device manufacturing methods, and more particularly to a movable body drive method and a movable body drive apparatus that drive a movable body along a predetermined plane, an exposure method that makes use of the movable body drive method and an exposure apparatus equipped with the movable body drive apparatus, a pattern formation method that makes use of the movable body drive method and a pattern formation apparatus equipped with the movable body drive apparatus, and a device manufacturing method that makes use of the pattern formation method.

2. Description of the Background Art

In a lithography process for manufacturing electron devices (microdevices) such as semiconductor devices (integrated circuits and the like) and liquid crystal display devices, an exposure apparatus such as a reduction projection exposure apparatus by a step-and-repeat method (a so-called stepper) or a reduction projection exposure apparatus by a step-and-scan method (a so-called scanning stepper (which is also called a scanner)) is mainly used.

In this type of exposure apparatus, in order to transfer a pattern of a reticle (or a mask) to a plurality of shot areas on a substrate such as a wafer or a glass plate (hereinafter, generically referred to as a wafer), a wafer stage that holds a wafer is driven in two-dimensional directions with, for example, a linear motor or the like. The position of the wafer stage was generally measured using a laser interferometer that has high stability for over a long period.

In recent years, however, requirements for overlay accuracy are increasing due to finer patterns that accompany higher integration of semiconductor devices, and now, short-term variation of measurement values caused by air fluctuations generated due to temperature change or temperature gradient of the atmosphere in the beam path of the laser interferometer has come to occupy a large percentage in the overlay budget.

Therefore, the inventor proposed before, an exposure apparatus that employs an encoder that has a measurement resolution of a level same as or higher than that of a laser interferometer and is less affected by air fluctuations compared with an interferometer in general, as a position measuring device of a wafer stage (e.g. refer to the pamphlet of International Publication No. 2007/097379). As a result of the inventor and the like performing various experiments, recently it has been found that if a measurement beam continues to be irradiated to a scale in which a diffraction grating is formed for over a given period of time or more, the scale minutely deforms due to thermal expansion and this minute deformation can be a factor of measurement error of a level that cannot be ignored.

SUMMARY OF THE INVENTION

According to a first aspect of the present invention, there is provided a movable body drive method of driving a movable body within a predetermined plane, the method comprising: a process of driving the movable body based on a result obtained by measuring a position of the movable body using a position measuring system that comprises a head that irradiates a measurement surface with a measurement beam, the measurement surface being installed on one of the movable body and an external of the movable body, and the head being installed on the other of the movable body and the external of the movable body; and a process of adjusting an irradiation amount of the measurement beam onto the measurement surface.

With this method, the irradiation heat given to the measurement surface can be adjusted by adjusting an irradiation amount of the measurement beam onto the measurement surface, and accordingly distortion of the measurement surface caused by the irradiation heat can be restrained. Consequently, it becomes possible to constantly maintain the high position measurement precision and secure the drive accuracy of the movable body.

According to a second aspect of the present invention, there is provided an exposure method of forming a pattern on a divided area on an object by irradiating the object with an energy beam, the method comprising: a process of driving a movable body that holds the object by using the movable body drive method of the present invention, to form a pattern on the divided area.

With this method, in order to form a pattern on a divided area on the object, the movable body that holds the object is driven using the movable body drive method of the present invention. Accordingly, it becomes possible to form the pattern on the divided area on the object with high precision.

According to a third aspect of the present invention, there is provided a pattern formation method of forming a pattern on an object, the method comprising: a process of driving a movable body that holds the object by using the movable body drive method of the present invention, to form a pattern on the object.

With this method, in order to form a pattern on the object, the movable body that holds the object is driven using the movable body drive method of the present invention. Accordingly, it becomes possible to form the pattern on the object with high precision.

According to a fourth aspect of the present invention, there is provided a device manufacturing method, comprising: a process of forming a pattern on an object by using the pattern formation method of the present invention; and a process of applying processing to the object on which the pattern has been formed.

According to a fifth aspect of the present invention, there is provided an exposure method of exposing an object with an energy beam, the method comprising: driving a movable body that can move within a predetermined plane while holding the object based on positional information of the movable body, the positional information being measured by using a position measuring system that has a measurement surface installed on one of the movable body and an external thereof, and a head installed on the other; and blocking a physical quantity that includes at least one of a thermal stress and a deformation quantity at the measurement surface from exceeding a permissible value due to irradiation of the measurement beam.

In this case, the physical quantity means a physical quantity related to deformation (including distortion caused by the thermal stress) at the measurement surface that occurs due to irradiation of the measurement beam.

With this method, by using the position measuring system, positional information of the movable body is measured, and the movable body is driven based on the positional information. Further, the physical quantity including at least one the thermal stress and the deformation quantity at the measurement surface of the position measuring system is blocked from exceeding the permissible value due to irradiation of the measurement beam. Consequently, the distortion of the measurement surface caused by the irradiation heat can be restrained, and thus, it becomes possible to constantly maintain the high position measurement precision and secure the drive accuracy of the movable body.

According to a sixth aspect of the present invention, there is provided a device manufacturing method, comprising: exposing an object by using the exposure method of the present invention; and developing the object that has been exposed.

According to a seventh aspect of the present invention, there is provided a movable body drive apparatus that drives a movable body within a predetermined plane, the apparatus comprising: a position measuring system that measures a position of the movable body by using a head that irradiates a measurement surface with a measurement beam, the measurement surface being installed on one of the movable body and an external of the movable body, and the head being installed on the other of the movable body and the external of the movable body; a drive device that drives the movable body within the predetermined plane based on a measurement result of the position measuring system; and an adjustment device that adjusts an irradiation amount of the measurement beam onto the measurement surface, by driving the movable body using the drive device.

With this apparatus, the adjustment device adjusts an irradiation amount of the measurement beam. onto the measurement surface by driving the movable body using the drive device. Therefore, the irradiation heat given to the measurement surface is adjusted, and distortion of the measurement surface due to the heat can be restrained. Consequently, it becomes possible to constantly maintain the high position measurement precision and secure the drive accuracy of the movable body.

According to an eighth aspect of the present invention, there is provided an exposure apparatus that forms a pattern on a divided area on an object by irradiating the object with an energy beam, the apparatus comprising: the movable body drive apparatus of the present invention that drives a movable body that holds the object within a predetermined plane, to form a pattern on the divided area.

With this apparatus, in order to form a pattern on the divided area on the object, the movable body drive apparatus of the present invention drives the movable body that holds the object within the predetermined plane. Accordingly, it becomes possible to form the pattern on the divided area on the object with high precision.

According to a ninth aspect of the present invention, there is provided a pattern formation apparatus that forms a pattern on an object, the apparatus comprising: a movable body that can move while holding the object; a pattern generating device that forms a pattern on the object; and the movable body drive apparatus of the present invention that drives the movable body within a predetermined plane.

With this apparatus, when the pattern generating device forms a pattern on the object, the movable body drive apparatus of the present invention drives the movable body that holds the object within the predetermined plane. Accordingly, it becomes possible to form the pattern on the object with high precision.

According to a tenth aspect of the present invention, there is provided an exposure apparatus that exposes an object with an energy beam, the apparatus comprising: a movable body that can move within a predetermined plane, while holding the object; a position measuring system that has a head and measures positional information of the movable body by irradiating a measurement surface with a measurement beam from the head and receiving a reflected light of the measurement beam, the measurement surface being installed on one of the movable body and an external of the movable body, and a head being installed on the other of the movable body and the external of the movable body; a drive system that drives the movable body based on the positional information; and a controller that blocks a physical quantity that includes at least one of a thermal stress and a deformation quantity at the measurement surface from exceeding a permissible value due to irradiation of the measurement beam.

With this apparatus, the position measuring system measures positional information of the movable body and the drive system drives the movable body based on the positional information. Further, the controller blocks a physical quantity that includes at least one of a thermal stress and a deformation quantity at the measurement surface of the position measuring system from exceeding a permissible value due to irradiation of the measurement beam. Consequently, the distortion of the measurement surface caused by the irradiation heat can be restrained, and thus, it becomes possible to constantly maintain the high position measurement precision and secure the drive accuracy of the movable body.

According to an eleventh aspect of the present invention, there is provided a device manufacturing method, comprising: exposing an object by using the exposure apparatus of the present invention; and developing the object that has been exposed.

BRIEF DESCRIPTION OF THE DRAWINGS

In the accompanying drawings;

FIG. 12 is a view used to explain yet another example of a stage drive method for avoiding continuous irradiation of measurement beams from the encoder heads and the Z heads to a same position on a scale; and.

DESCRIPTION OF THE EMBODIMENTS

An embodiment of the present invention is described below, with reference to FIGS. 1 to 13.

Figure 1:
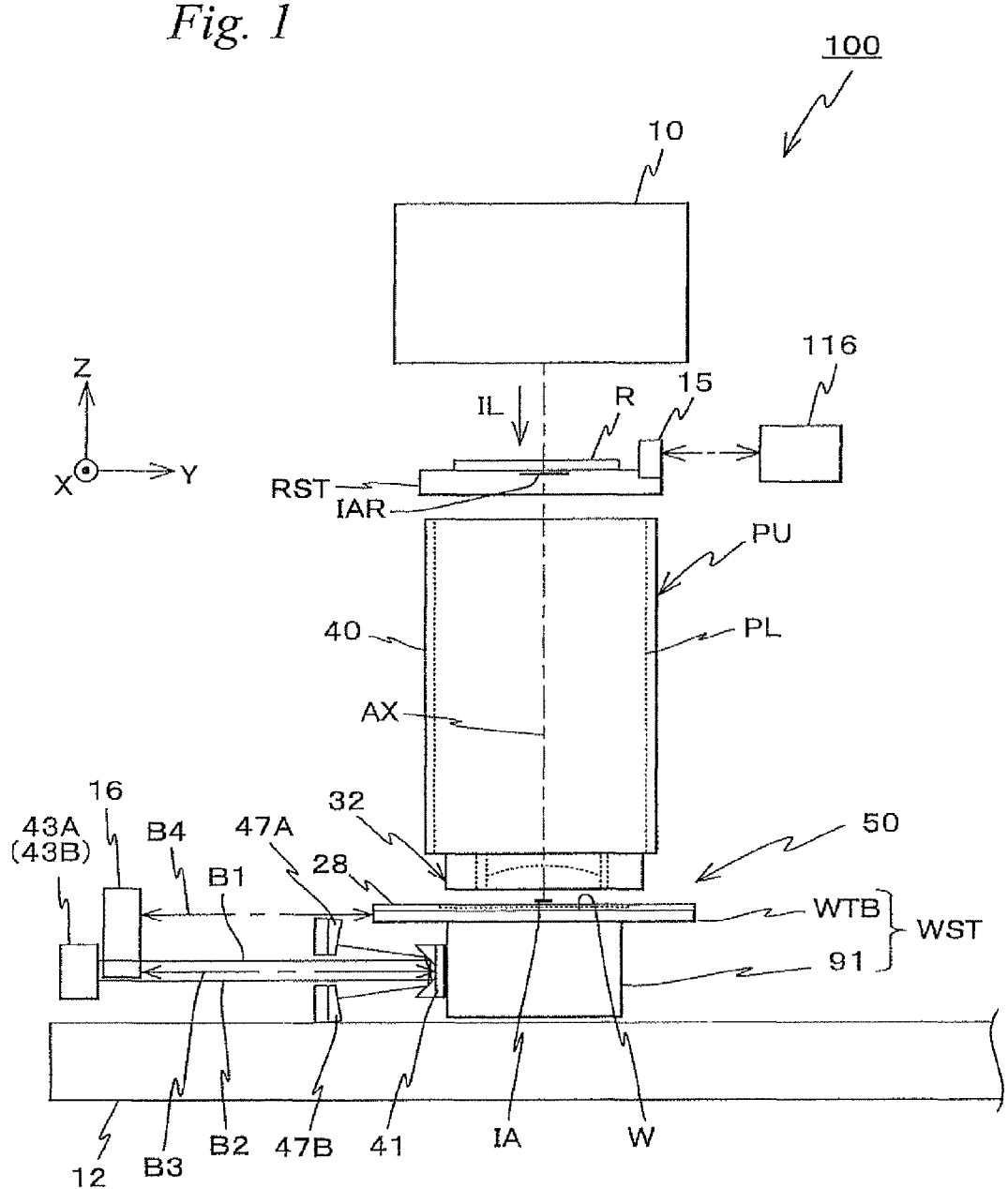
FIG. 1 is a view schematically showing a configuration of an exposure apparatus related to an embodiment.

FIG. 1 schematically shows a configuration of an exposure apparatus 100 of the embodiment. Exposure apparatus 100 is a projection exposure apparatus by a step-and-scan method, which is a so-called scanner. As is described later, a projection optical system PL and a primary alignment system AL1 are arranged in the embodiment, and in the description below, the explanation is given assuming that a direction parallel to an optical axis AX of projection optical system PL is a Z-axis direction, a direction in which a reticle and a wafer are relatively scanned within a plane orthogonal to the Z-axis direction is a Y-axis direction, and a direction that is orthogonal to a Z-axis and a Y-axis is an X-axis direction, and rotation (inclination) directions about an X-axis, the Y-axis and the Z-axis are θx, θy and θz directions, respectively.

Exposure apparatus 100 is equipped with an illumination system 10, a reticle stage RST, a projection unit PU, a stage device 50 having a wafer stage WST, and their control system, and the like. In FIG. 1, a wafer W is mounted on wafer stage WST.

Illumination system 10 includes: a light source; and an illumination optical system that has an illuminance uniformity optical system containing an optical integrator and the like, and a reticle blind and the like (none of which are shown), as is disclosed in, for example, U.S. Patent Application Publication No. 2003/0025890 and the like. Illumination system 10 illuminates a slit-shaped illumination area IAR that is defined by the reticle blind (the masking system) on reticle R by an illumination light (exposure light) IL with substantially uniform illuminance. In this case, as illumination light IL, an ArF excimer laser light (wavelength: 193 nm) is used as an example.

On reticle stage RST, reticle R having a pattern surface (the lower surface in FIG. 1) on which a circuit pattern and the like are formed is fixed by, for example, vacuum suction. Reticle stage RST is finely drivable within an XY plane and also drivable at a designated scanning speed in a scanning direction (which is the Y-axis direction being a lateral direction of the page surface of FIG. 1), by a reticle stage drive system 11 (not shown in FIG. 1, refer to FIG. 7) including, for example, a linear motor or the like.

Positional information (including rotational information in the θz direction) within the XY plane (the movement plane) of reticle stage RST is constantly detected at a resolution of, for example, around 0.25 nm with a reticle laser interferometer (hereinafter, referred to as a "reticle interferometer") 116 via a movable mirror 15 (in actuality, a Y movable mirror (or a retroreflector) having a reflection surface orthogonal to the Y-axis direction and an X movable mirror having a reflection surface orthogonal to the X-axis direction are arranged). The measurement values of reticle interferometer 116 are sent to a main controller 20 (not shown in FIG. 1, refer to FIG. 7).

Projection unit PU is placed below reticle stage RST in FIG. 1 and supported by a main frame (not shown). Projection unit PU includes a barrel 40 and projection optical system PL held within barrel 40. As projection optical system PL, for example, a dioptric system that is composed of a plurality of optical elements (lens elements) disposed along optical axis AX parallel to the Z-axis direction is used. Projection optical system PL is, for example, both-side telecentric and has a predetermined projection magnification (e.g. one-quarter, one-fifth, one-eighth times, or the like). Therefore, when illumination area IAR on reticle R is illuminated by illumination light IL from illumination system 10, illumination light IL having passed through reticle R whose pattern surface is placed substantially coincident with a first plane (an object plane) of projection optical system PL forms a reduced image of a circuit pattern (a reduced image of a part of a circuit pattern) of reticle R within illumination area IAR on an area (hereinafter, also referred to as an "exposure area") IA that is conjugate to illumination area IAR described above on wafer W, which is placed on the second plane (the image plane) side of projection optical system PL and whose surface is coated with a resist (a sensitive agent), via projection optical system PL (projection unit PU). Then, by moving reticle R in the scanning direction (the Y-axis direction) relative to illumination area IAR (illumination light IL) and also moving wafer W in the scanning direction (the Y-axis direction) relative to exposure area IA (illumination light IL) by synchronous drive of reticle stage RST and wafer stage WST, scanning exposure of one shot area (divided area) on wafer W is performed, and a pattern of reticle R is transferred to the shot area. That is, in the embodiment, a pattern of reticle R is generated on wafer W by illumination system 10 and projection optical system PL, and the pattern is formed on wafer W by exposure of a sensitive layer (a resist layer) on wafer W with illumination light IL.

Figure 7:
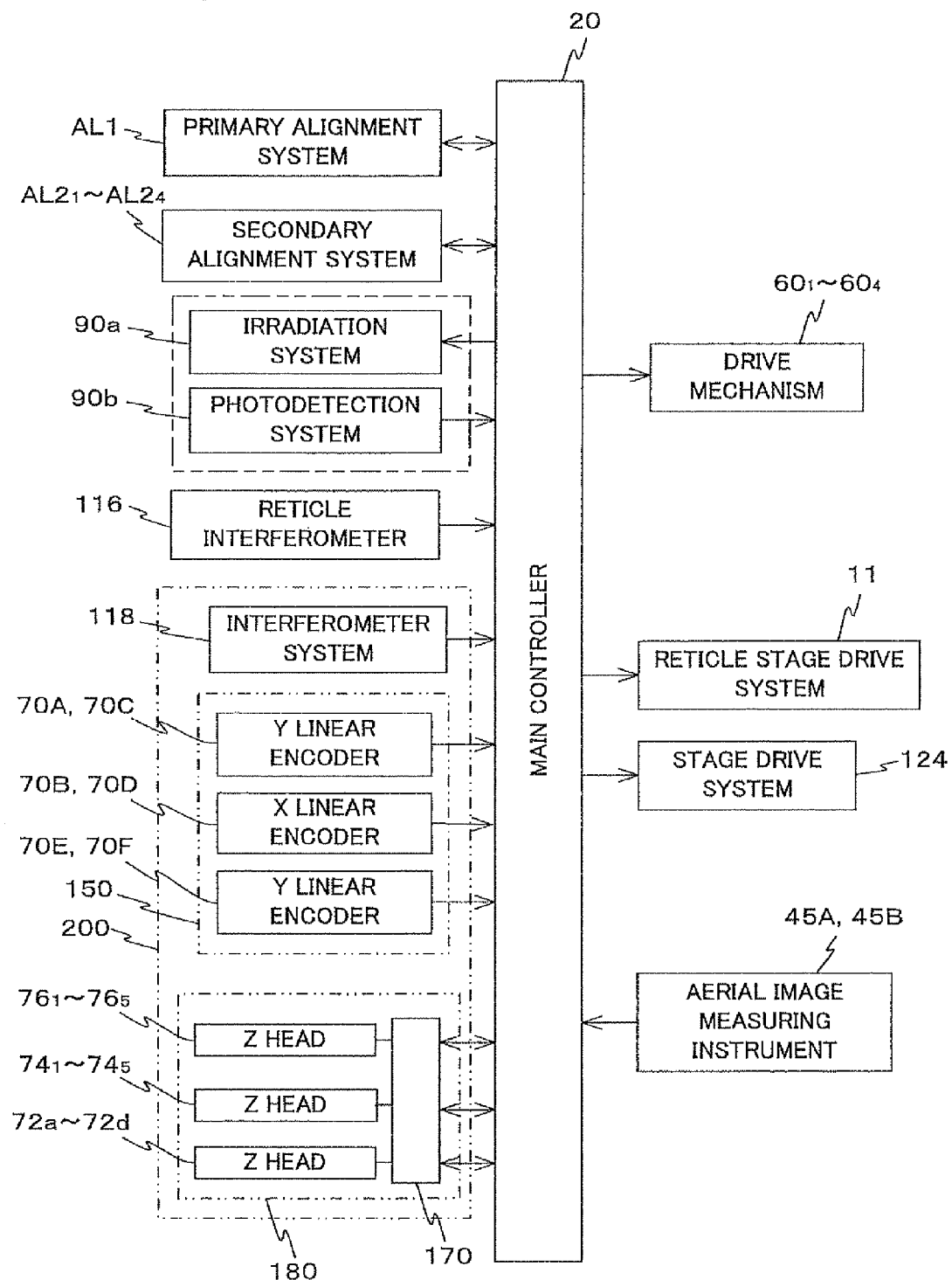
FIG. 7 is a block diagram showing a main configuration of a control system of the exposure apparatus related to the embodiment.

As shown in FIG. 1, stage device 50 is equipped with wafer stage WST placed above a base board 12, a measurement system 200 (refer to FIG. 7) that measures positional information of wafer stage WST, a stage drive system 124 (refer to FIG. 7) that drives wafer stage WST, and the like. As shown in FIG. 7, measurement system 200 includes an interferometer system 118, an encoder system 150, a surface position measuring system 180, and the like.

Wafer stage WST is supported above a base board 12 by a noncontact bearing (not shown), for example, by an air bearing or the like via a clearance of around several μm. Wafer stage WST includes a stage main body 91 and a wafer table WTB mounted on stage main body 91. Wafer table WTB and stage main body 91 are driven by stage drive system 124 that includes, for example, a linear motor or the like. Accordingly, wafer W is movable in directions of six degrees of freedom (X, Y, Z, θx, θy, θz) above base board 12.

In the center of the upper surface of wafer table WTB, a wafer holder (not shown) that holds wafer W by vacuum suction or the like is arranged.

On the +Y side of the wafer holder on the upper surface of wafer table WTB, a measurement plate 30 is placed. On measurement plate 30, a fiducial mark FM is placed in the center and on both sides of fiducial mark FM in the X-axis direction, a pair of aerial image measurement slit patterns (measurement patterns having a slit shape) SL are placed. And, corresponding to each aerial image measurement slit pattern SL, an optical system, a photodetection element and the like are placed inside wafer stage WST. More specifically, a pair of aerial image measuring instruments 45A and 45B (refer to FIG. 7) including aerial image measurement slit patterns SL are arranged on wafer table WTB. Incidentally, only a part of the optical system is placed inside wafer stage WST and the photodetection element or the like that is a heat source can be placed external to wafer stage WST.

Further, on the upper surface of wafer table WTB, scales that are used in the encoder system (to be described later) are formed. To be specific, in areas on one side and the other side of the wafer table WTB upper surface in the X-axis direction (a lateral direction of the page surface of FIG. 2), Y scales $39Y_1$ and $39Y_2$ are formed respectively. Y scales $39Y_1$ and $39Y_2$ are each configured of a reflective type grating (e.g. diffraction grating) whose periodic direction is in the Y-axis direction, in which grid lines 38 with the X-axis direction serving as their longitudinal directions are disposed with a predetermined pitch in the Y-axis direction.

Similarly, in areas on one side and the other side of the wafer table WTB upper surface in the Y-axis direction (a vertical direction of the page surface of FIG. 2), X scales $39X_1$ and $39X_2$ are formed respectively in a state of sandwiched between Y scales $39Y_1$ and $39Y_2$. X scales $39X_1$ and $39X_2$ are each configured of a reflective type grating (e.g. diffraction grating) whose periodic direction is in the X-axis direction, in which grid lines 37 with the Y-axis direction serving as their longitudinal directions are disposed with a predetermined pitch in the X-axis direction.

Figure 2:
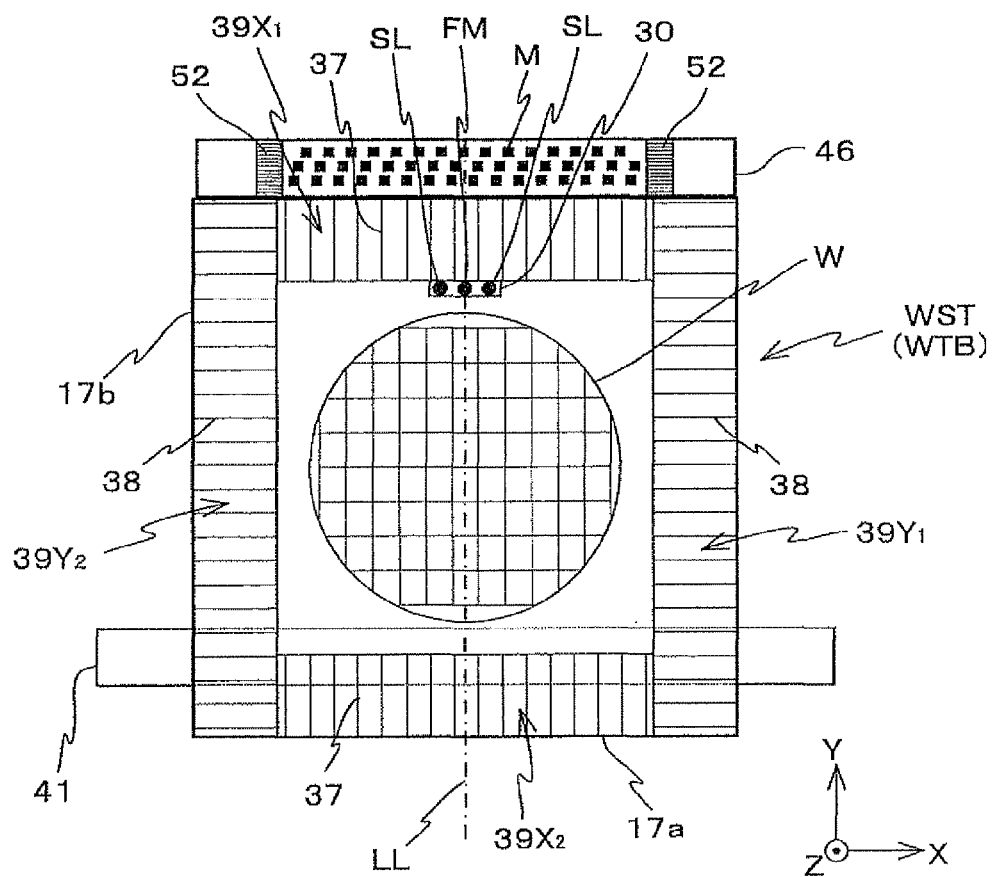
FIG. 2 is a plan view showing a wafer stage.

Incidentally, a pitch of grid lines 37 and 38 is set, for example, to 1 µm. In FIG. 2 and other drawings, the pitch of the grid lines is shown larger than the actual pitch for the sake of convenience for illustration.

Further, in order to protect each diffraction grating, it is also effective to cover each scale with a glass plate having a low coefficient of thermal expansion. In this case, as the glass plate, the one having a thickness which is the same as or close to the thickness of the wafer, for example, a thickness of 1 mm can be used, and the glass plate is installed on the upper surface of wafer table WTB (each scale) so that the surface of the glass plate and the wafer surface have the same height (are flush).

Further, on the −Y end surface and the −X end surface of wafer table WTB, as shown in FIG. 2, a reflection surface 17a and a reflection surface 17b that are used in the interferometer system (to be described later) are formed.

On the +Y end surface of wafer table WTB, as shown in FIG. 2, a fiducial bar (hereinafter, shortly referred to as a "FD bar") 46 is arranged extending in the X-axis direction, which is similar to the CD bar disclosed in the pamphlet of International Publication No. 2007/097379 (U.S. Patent Application Publication No. 2008/0088843). In the vicinity of the end on one side and the other of FD bar in its longitudinal direction, a reference grating (e.g. diffraction grating) 52 having a periodic direction in the Y-axis direction is respectively formed in a symmetric arrangement with respect to a center line LL of wafer table WTB. Further, on the upper surface of FD bar 46, a plurality of reference marks M are formed. As each reference mark M, a two-dimensional mark having a size that can be detected by the alignment systems (to be described later) is used. In the embodiment, the surface of the cover glass plate of each scale, the upper surface of wafer table WTB, the surface of measurement plate 30, the surface of FD bar 46 (to be described later), and the surface of the wafer are flush. Further, at least a part of these surfaces may have liquid repellency.

Figure 4:
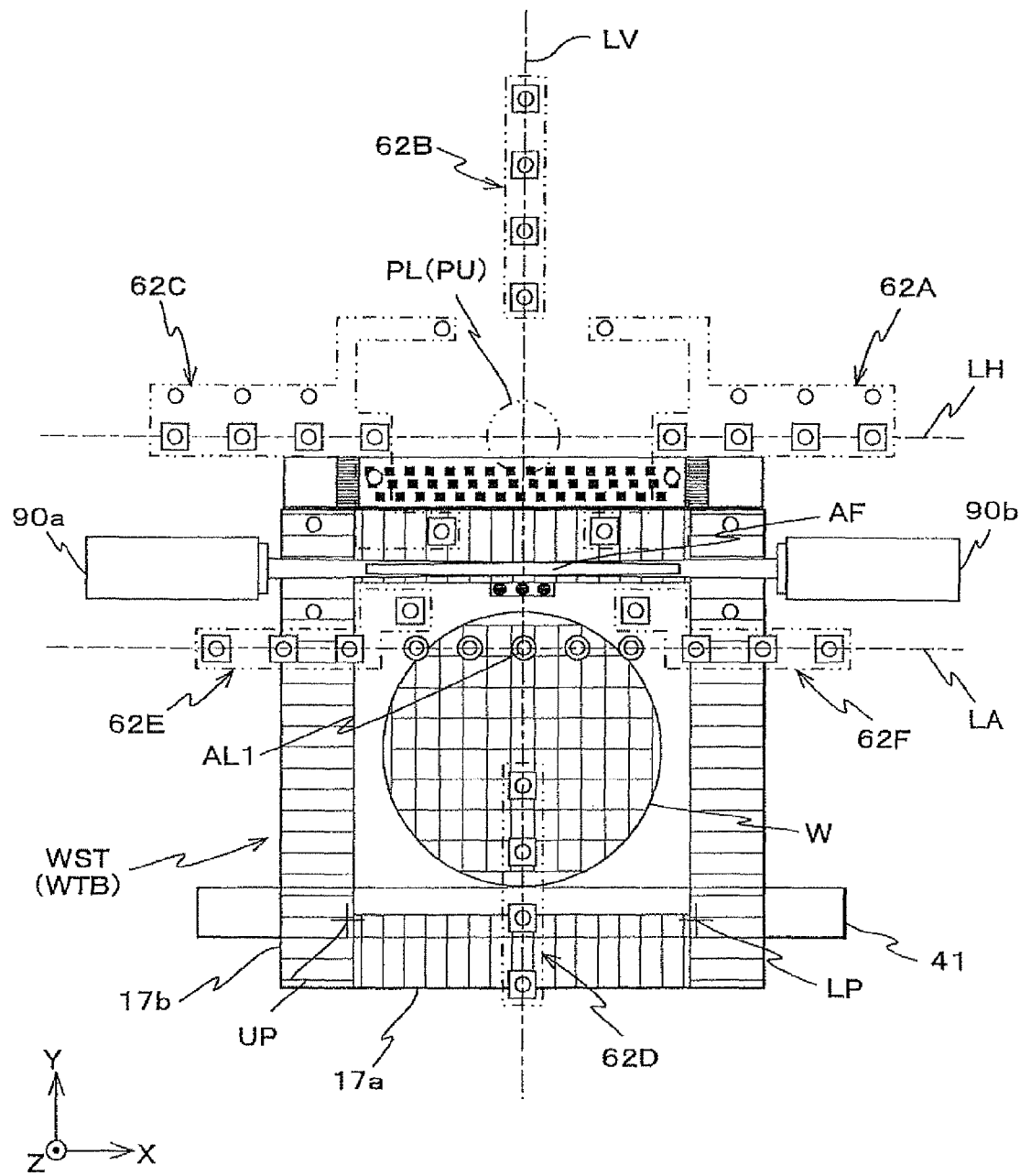
FIG. 4 is a plan view showing a stage device which the exposure apparatus shown in FIG. 1 is equipped with, and an arrangement of sensor units.
Figure 5:
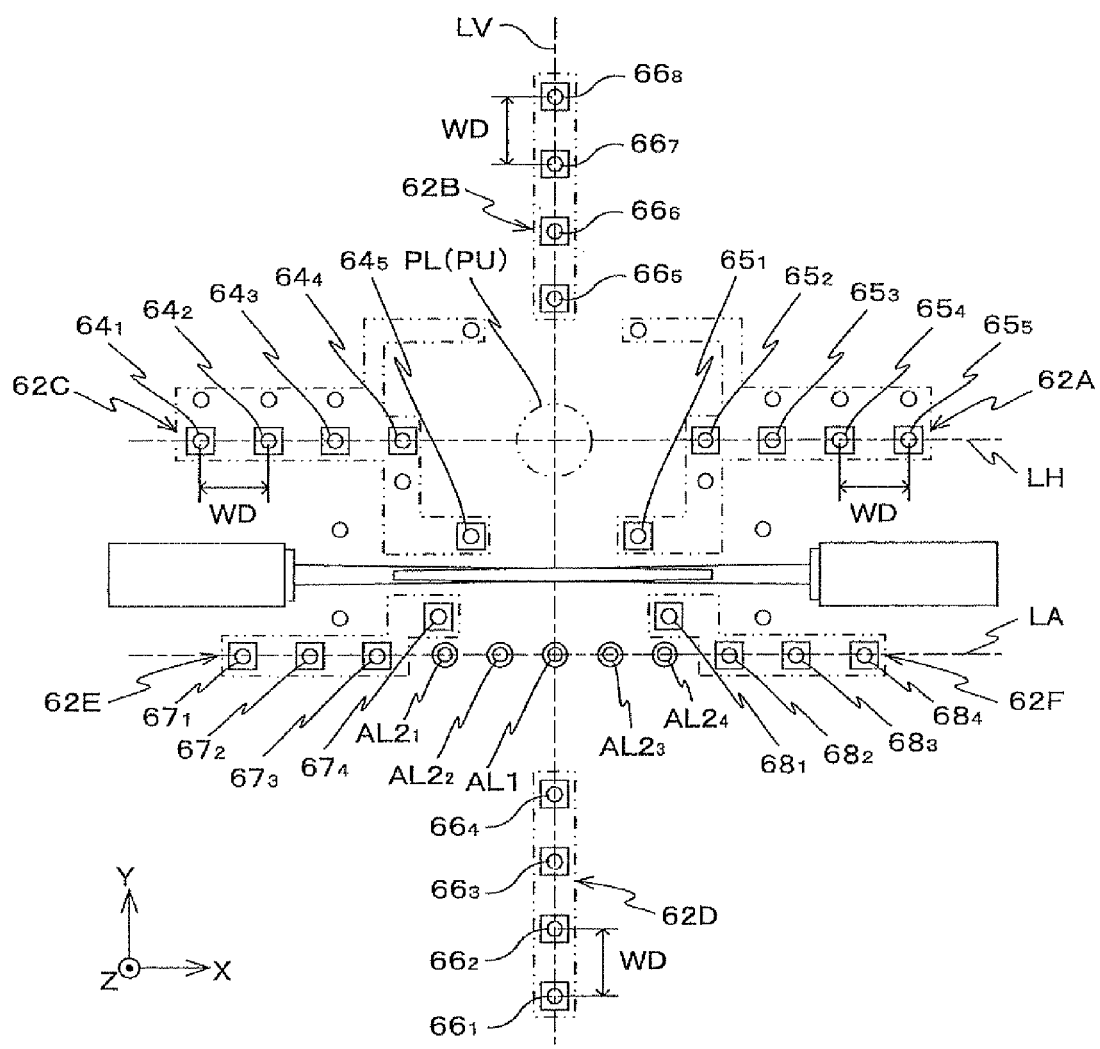
FIG. 5 is a plan view showing an arrangement of encoder heads (X heads, Y heads) and alignment systems.

In exposure apparatus 100 of the embodiment, as shown in FIGS. 4 and 5, primary alignment system AL1 having a detection center at a position a predetermined distance apart on the −Y side from optical axis AX of projection optical system PL, is arranged on a straight line (a reference axis) LV parallel to the Y-axis passing through optical axis AX. Primary alignment system AL1 is fixed to the lower surface of the main frame referred to earlier. As shown in FIG. 5, on one side and the other side in the X-axis direction with primary alignment system AL1 in between, secondary alignment systems $AL2_1$ and $AL2_2$, and $AL2_3$ and $AL2_4$ whose detection centers are almost symmetrically placed with respect to reference axis LV are arranged, respectively. Secondary alignment systems $AL2_1$ to $AL2_4$ are fixed to the lower surface of the main frame (not shown) via a movable support member, and the relative positions of their detection areas in the X-axis direction can be adjusted by drive mechanisms $60_1$ to $60_4$ (refer to FIG. 7).

In the embodiment, as each of alignment system AL1 and $AL2_1$ to $AL2_4$, for example, an FIA (Field Image Alignment) system by an image processing method is used. The imaging signals from each of alignment systems AL1 and $AL2_1$ to $AL2_4$ are supplied to main controller 20 via a signal processing system (not shown).

In the embodiment, positional information (including rotational information in the θz direction) of wafer stage WST (wafer table WTB) within the XY plane is measured mainly using encoder system 150 (to be described later). Interferometer system 118 is used when wafer stage WST is located outside the measurement area of encoder system 150 (e.g. near an unloading position UP (refer to FIG. 8) and a loading position LP (refer to FIG. 9)). Further, interferometer system 118 is secondarily used in the cases such as where a long-term variation (e.g. due to deformation of the scales according to time passage, or the like) of measurement results of encoder system 150 is corrected (calibrated). Accordingly, for measurement of positional information of wafer stage WST (wafer table WTB) within the XY plane, interferometer system 118 does not necessarily have to be arranged. Meanwhile, positional information of wafer stage WST (wafer table WTB) can also be measured using interferometer system 118 and encoder system 150 together.

In exposure apparatus 100 of the embodiment, a plurality of head units that constitute encoder system 150 are arranged to measure the position (X, Y, θz) of wafer stage WST within the XY plane, independently from interferometer system 118.

As shown in FIG. 4, on the +X side, the +Y side and the −X side of projection unit PU and on the −Y side of alignment system AL1, four head units 62A, 62B, 62C and 62D are placed, respectively. Further, head units 62E and 62F are placed on both outer side in the X-axis direction of alignment systems AL1 and $AL2_1$ to $AL2_4$, respectively. These head units 62A to 62F are fixed to the main frame referred to earlier in a suspended state via a support member.

As shown in FIG. 5, head units 62A and 62C are respectively equipped with a plurality (five in this case) of Y heads $65_1$ to $65_5$ and Y heads $64_1$ to $64_5$. In this case, Y heads $65_2$ to $65_5$ and Y heads $64_1$ to $64_4$ are placed at a distance WD on a reference axis LH. Y head $65_1$ and Y head $64_5$ are placed at positions on the −Y side of projection unit PU, which are a predetermined distance apart from reference axis LH in the −Y direction. A distance between Y heads $65_1$ and $65_2$ and a distance between Y heads $64_4$ to $64_5$ in the X-axis direction are also set to distance WD. Incidentally, Y heads $65_1$ to $65_5$ and Y heads $64_5$ to $64_1$ are placed symmetrically with respect to reference axis LV. In the description below, Y heads $65_1$ to $65_5$ and Y heads $64_1$ to $64_5$ are also described as Y heads 65 and Y heads 64, as needed.

Head unit 62A constitutes a multiple-lens (five-lens, in this case) Y linear encoder 70A (refer to FIG. 7) that measures the position in the Y-axis direction (Y-position) of wafer stage WST (wafer table WTB) using Y scale $39Y_1$. Similarly, head unit 62C constitutes a multiple-lens (five-lens, in this case) Y linear encoder 70C (refer to FIG. 7) that measures the Y-position of wafer stage WST (wafer table WTB) using Y scale $39Y_2$. Incidentally, in the description below, the Y linear encoders are shortly referred to as "Y encoders" or "encoders", as needed.

In this case, distance WD in the X-axis direction between five Y heads 65 or 64 (to be more precise, irradiation points on the scale of measurement beams which Y heads 65 or 64 emit) that are respectively equipped in head units 62A or 62C is set slightly shorter than the width in the X-axis direction of Y scale $39Y_1$ or $39Y_2$ (to be more precise, the length of grid line 38). Accordingly, for example, during exposure, at least one head of five Y heads 65 and at least one head of Y heads 64 constantly face (irradiate measurement beams to) corresponding Y scales $39Y_1$ and $39Y_2$, respectively.

As shown in FIG. 5, head unit 62B is equipped with a plurality (four, in this case) of X heads $66_5$ to $66_8$ that are placed at distance WD on reference axis LV. Further, head unit 62D is equipped with a plurality (four, in this case) of X heads $66_1$ to $66_4$ that are placed at distance WD on reference axis LV. In the description below, X heads $66_5$ to $66_8$ and X heads $66_1$ to $66_4$ are also described as X heads 66, as needed.

Head unit 62B constitutes a multiple-lens (four-lens, in this case) X linear encoder 70B (refer to FIG. 7) that measures the position in the X-axis direction (X-position) of wafer stage WST (wafer table WTB) using X scale $39X_1$. And, head unit 62D constitutes a multiple-lens (four-lens, in this case) X linear encoder 70D (refer to FIG. 7) that measures the X-position of wafer stage WST (wafer table WTB) using X scale $39X_2$. Incidentally, in the description below, the X linear encoders are shortly referred to as "encoders", as needed.

In this case, distance WD in the Y-axis direction between adjacent X heads 66 (to be more precise, irradiation points on the scale of measurement beams which X heads 66 emit) that are respectively equipped in head units 62B or 62D is set shorter than the width in the Y-axis direction of X scale $39X_1$ and $39X_2$ (to be more precise, the length of grid line 37). Accordingly, for example, during exposure, alignment or the like, at least one head of eight X heads 66 in total, which head units 62B and 62D are equipped with, constantly faces (irradiates a measurement beam to) corresponding X scale $39X_1$ or $39X_2$.

Incidentally, a distance between X head $66_5$ on the most −Y side of head unit 62B and X head $66_4$ on the most +Y side of head unit 62D is set shorter than the width of wafer table WTB in the Y-axis direction so that switching (linkage) between the two X heads can be performed by movement of wafer stage WST in the Y-axis direction.

As shown in FIG. 5, head unit 62E is equipped with a plurality (four, in this case) of Y heads $67_1$ to $67_4$. In this case, three Y heads $67_1$ to $67_3$ are placed at substantially the same distance as distance WD on a reference axis LA, on the −X side of secondary alignment system $AL2_1$. Y head $67_4$ is placed at a predetermined distance away from reference axis LA in the +Y direction, on the +Y side of secondary alignment system $AL2_1$. Incidentally, the distance between Y heads $67_3$ to $67_4$ in the X-axis direction is also set to distance WD.

Head unit 62F is equipped with a plurality (four, in this case) of Y heads $68_1$ to $68_4$. Y heads $68_1$ to $68_4$ are placed at symmetric positions to Y heads $67_4$ to $67_1$ with respect to reference axis LV. More specifically, three Y heads $68_2$ to $68_4$ are placed at substantially the same distance as distance WD on reference axis LA, on the +X side of secondary alignment system $AL2_4$. Y head $68_1$ is placed at a predetermined distance away from reference axis LA in the +Y direction, on the +Y side of secondary alignment system $AL2_4$. Incidentally, the distance between Y heads $68_1$ and $68_2$ in the X-axis direction is also set to distance WD. In the description below, Y heads $67_4$ to $67_1$ and Y heads $68_1$ to $68_4$ are also described as Y heads 67 and Y heads 68, as needed.

During alignment measurement, at least one each of Y heads 67 and 68 faces Y scales $39Y_2$ and $39Y_1$, respectively. With the Y heads 67 and 68 (i.e. Y linear encoders 70E and 70F that are constituted by these Y heads 67 and 68), the Y-position (and the θz rotation) of wafer stage WST is measured.

Further, in the embodiment, during baseline measurement of the secondary alignment systems and the like, Y heads $67_3$ and $68_2$ that are adjacent to secondary alignment systems $AL2_1$ and $AL2_4$ in the X-axis direction face a pair of reference gratings 52 on FD bar 46 respectively, and with Y heads $67_3$ and $68_2$ that face the pair of reference gratings 52, the Y-position of FD bar 46 is measured at the position of each of reference gratings 52. In the description below, encoders that are constituted by Y heads $67_3$ and $68_2$ that respectively face the pair of reference gratings 52 are referred to as Y linear encoders $70E_2$ and $70F_2$ (refer to FIG. 7). Further, for identification, Y encoders that are constituted by Y heads 67 and 68 that face Y scales $39Y_2$ and $39Y_1$ are referred to as Y encoders $70E_1$ and $70F_1$.

The measurement values of linear encoders 70A to 70F described above are supplied to main controller 20, and main controller 20 controls the position of wafer stage WST within the XY plane based on the measurement values of three of linear encoders 70A to 70D, or three of linear encoders $70E_1$, $70F_1$, 70B and 70D, and also controls rotation in the θz direction of FD bar 46 (wafer stage WST) based on the measurement values of linear encoders $70E_2$ and $70F_2$.

Incidentally, as each encoder head (Y head, X head), for example, an interference type encoder head, which is disclosed in the pamphlet of International Publication No. 2007/097379, can be used. In this type of the encoder head, two measurement lights are irradiated to the corresponding scales, and return lights of the two measurement lights are synthesized into one interference light, and then the interference light is received, and the intensity of the interference light is measured using the photodetector. With the intensity change of the interference light, the displacement of the scale in the measurement direction (the periodic direction of the diffraction grating) is measured. Incidentally, the method of each encoder head (Y head, X head) is not limited to the diffraction interference method described above, but various methods such as a so-called pickup method can be used.

Figure 3:
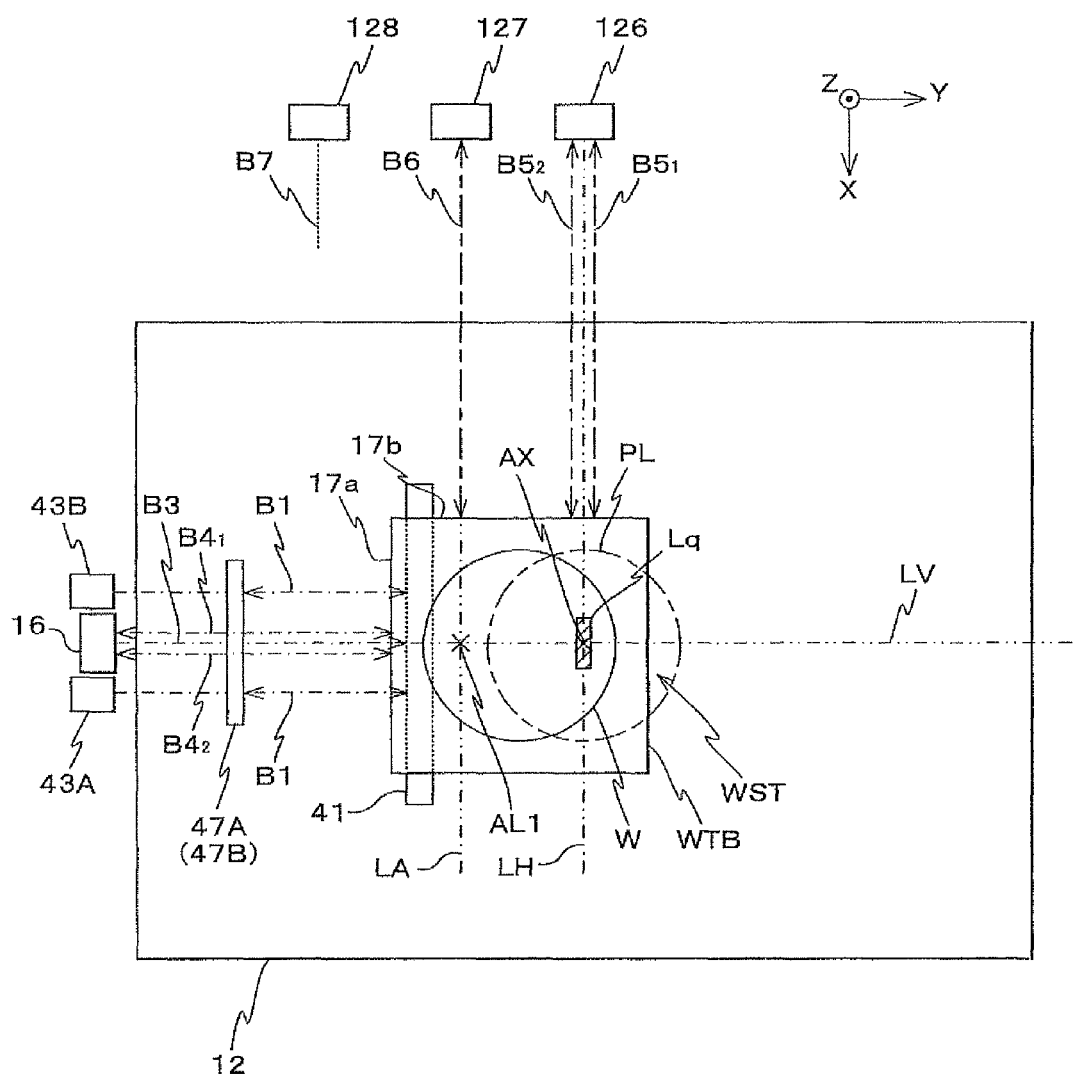
FIG. 3 is a plan view showing a stage device which the exposure apparatus shown in FIG. 1 is equipped with, and an arrangement of interferometers.

As shown in FIG. 3, interferometer system 118 is equipped with a Y interferometer 16 and three X interferometers 126, 127 and 128 that measure positional information of wafer stage WST within the XY plane, by each irradiating reflection surface 17a or 17b with an interferometer beam (measurement beam) and receiving a reflected light of the interferometer beam. To be specific, Y interferometer 16 irradiates reflection surface 17a and a movable mirror 41 (to be described later) with at least three measurement beams parallel to the Y-axis including a pair of measurement beams $B4_1$ and $B4_2$ that are symmetric with respect to reference axis LV.

And, as shown in FIG. 3, X interferometer 126 irradiates reflection surface 17b with at least three measurement beams parallel to the X-axis including a pair of measurement beams $B5_1$ and $B5_2$ that are symmetric with respect to straight line (reference axis) LH parallel to the X-axis that is orthogonal to optical axis AX and reference axis LV. Further, X interferometer 127 irradiates reflection surface 17b with at least two measurement beams parallel to the X-axis including a measurement beam B6 that has a measurement axis in straight line (reference axis) LA parallel to the X-axis that is orthogonal to reference axis LV at the detection center of alignment system AL1. Further, X interferometer 128 irradiates reflection surface 17b with a measurement beam B7 parallel to the X-axis.

Positional information from the respective interferometers described above of interferometer system 118 is supplied to main controller 20. Based on, for example, the measurement results of Y interferometer 16 and X interferometer 126 or 127, main controller 20 can also compute rotational information in the θx direction (i.e. pitching), rotational information in the θy direction (i.e. rolling), and rotational information in the θz direction (i.e. yawing), in addition to the X and Y positions of wafer table WTB (wafer stage WST).

As shown in FIGS. 1 and 3, interferometer system 118 is further equipped with a pair of Z interferometers 43A and 43B. Z interferometers 43A and 43B are placed facing movable mirror 41 that has a recessed reflection surface fixed to the −Y side surface of stage main body 91. In this case, as can be seen from FIG. 2, movable mirror 41 is designed to have the length in the X-axis direction longer than that of reflection surface 17a of wafer table WTB.

Z interferometers 43A and 43B irradiate fixed mirrors 47A and 47B, for example, which are fixed to the main frame referred to earlier, with two measurement beams B1 and B2 parallel to the Y-axis respectively, and receives reflected lights of the respective measurement beams, thereby measuring the optical path lengths of measurement beams B1 and B2. Based on the measurement results, main controller 20 computes the position of wafer stage WST in directions of four degrees of freedom (Y, Z, θy and θz).

Figure 6:
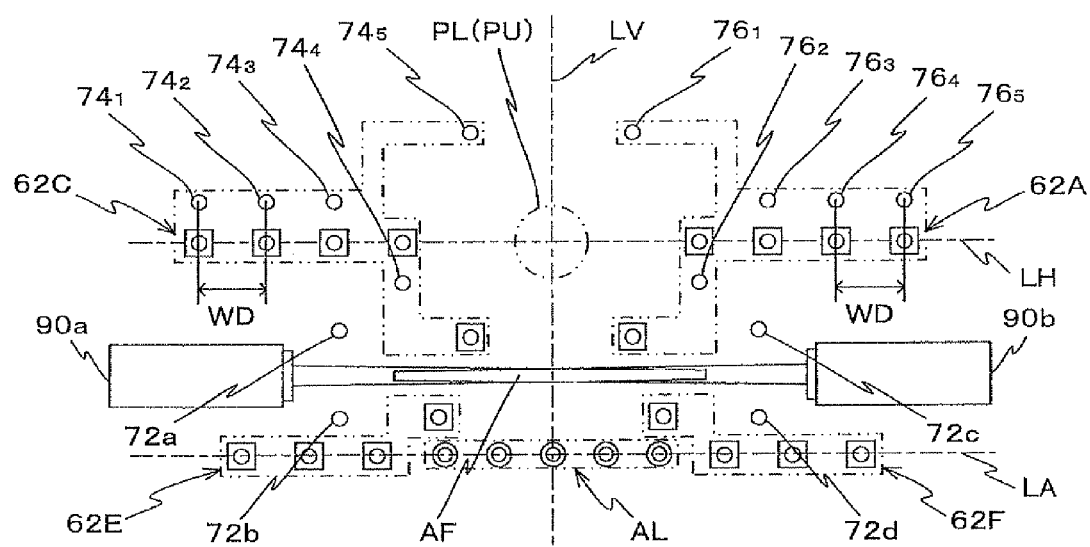
FIG. 6 is a plan view showing an arrangement of Z heads and a multipoint AF system.

Moreover, in exposure apparatus 100 of the embodiment, as shown in FIGS. 4 and 6, a multipoint focal position detecting system (hereinafter, shortly referred to as a "multipoint AF system") that is composed of an irradiation system 90a and a photodetection system 90b is arranged. As the multipoint AF system, a system by an oblique incident method having a configuration similar to the one disclosed in, for example, U.S. Pat. No. 5,448,332 and the like is employed. In the embodiment, as an example, irradiation system 90a is placed on the +Y side of the −X end of head unit 62E described earlier, and in a state of being opposed to irradiation system 90a, photodetection system 90b is placed on the +Y side of the +X end of head unit 62F described earlier. Incidentally, the multipoint AF system (90a, 90b) is fixed to the lower surface of the main frame referred to earlier.

A plurality of detection points of the multipoint AF system (90a, 90b) are placed on the surface to be detected at a predetermined distance along the X-axis direction. In the embodiment, the detection points are placed in a matrix shape having, for example, one row and M columns (M is a total number of the detection points) or two rows and N columns (N=M/2). In FIGS. 4 and 6, the plurality of detection points to which a detection beam is irradiated respectively are not individually shown, but shown as an elongated detection area (beam area) AF that extends in the X-axis direction between irradiation system 90a and photodetection system 90b. Since the length of detection area AF in the X-axis direction is set the same as or close to the diameter of wafer W, positional information in the Z-axis direction (surface position information) can be measured on substantially the entire surface of wafer W by only scanning wafer W in the Y-axis direction once.

As shown in FIG. 6, in the vicinity of both ends of detection area AF of the multipoint AF system (90a, 90b), each one pair of heads for Z position measurement (hereinafter, shortly referred to as "Z heads") 72a, 72b, and 72c, 72d that constitute a part of surface position measuring system 180 are arranged in a symmetric arrangement with respect to reference axis LV. Z heads 72a to 72d are fixed to the lower surface of the main frame referred to previously. Incidentally, in the description below, Z heads 72a to 72d are collectively described as Z heads 72.

As Z heads 72a to 72d, for example, a head of an optical method displacement sensor that is similar to an optical pickup used in a CD drive device and the like is used. Z heads 72a to 72d each irradiate wafer table WTB with a measurement beam from above, and receive a reflected light of the measurement beam, thereby measuring the surface position of wafer table WTB at the irradiation point. Incidentally, in the embodiment, a configuration is employed in which the measurement beams of the Z heads are reflected by the reflective type diffraction gratings that constitute Y scale $39Y_1$ and $39Y_2$ described earlier.

Furthermore, head units 62A and 62C described previously are equipped with five Z heads 76j and 74i (i, j=1 to 5), respectively, at the same X-positions as with five Y heads $65_j$ and 64i (i, j32 1 to 5) which are equipped in head units 62A and 62C respectively, but with the Y-positions being shifted. In this case, three Z heads $76_3$ to $76_5$ and $74_1$ to $74_3$ on the outer side, which belong to head units 62A and 62C respectively, are placed parallel to reference axis LH, at a predetermined distance spaced apart in the +Y direction from reference axis LH. And, Z heads $76_1$ and $74_5$ on the innermost side, which belong to head units 62A and 62C respectively, are placed on the +Y side of projection unit PU, and the remaining Z head $76_2$ and $74_4$ are placed on the −Y side of Y heads $65_2$ and $64_4$ respectively. And, five Z heads 76 and five Z heads 74 that respectively belong to head units 62A and 62C are placed symmetric to each other with respect to reference axis LV. Incidentally, as each Z head 76 or 74, a head of an optical method displacement sensor that is similar to Z heads 72a to 72d described previously is employed.

As is described earlier, head units 62A and 62C are respectively equipped with five Z heads 76j and five Z heads 74i at the X positions which are the same as with five Y heads 65j and five Y heads 64i that are equipped respectively in head units 62A to 62C, and therefore, for example, during exposure and the like, at least one head of five Z heads 76 and at least one head of five Z heads 74 constantly face corresponding Y scales $39Y_1$ and $39Y_2$, which is similar to the case of Y heads 65 and 64.

As shown in FIG. 7, Z heads 72a to 72d, $74_1$ to $74_5$, and $76_1$ to $76_5$ described above are connected to main controller 20 via a signal processing/selection device 170, and main controller 20 selects an arbitrary Z head from among Z heads 72a to 72d, $74_1$ to $74_5$, and $76_1$ to $76_5$ via signal processing/selection device 170 and makes the arbitrary Z head be in an operating condition, and receives surface position information detected by the Z head in the operating condition via signal processing/selection device 170. In the embodiment, surface position measuring system 180, which measures positional information of wafer stage WST in the Z-axis direction and the inclination directions (mainly in the θy direction) with respect to the XY plane, is configured including Z heads $72a$ to $72d$, $74_1$ to $74_5$ and $76_1$ to $76_5$, and signal processing/selection device 170.

FIG. 7 shows a main configuration of a control system of exposure apparatus 100. This control system is configured mainly of main controller 20 composed of a microcomputer (or a workstation) that performs overall control of the entire apparatus.

In the exposure apparatus of the embodiment having the configuration as described above, the process using wafer stage WST is executed by main controller 20 according to the procedure similar to the procedure disclosed in, for example, an embodiment of the pamphlet of International Publication No. 2007/097379.

Figure 8:
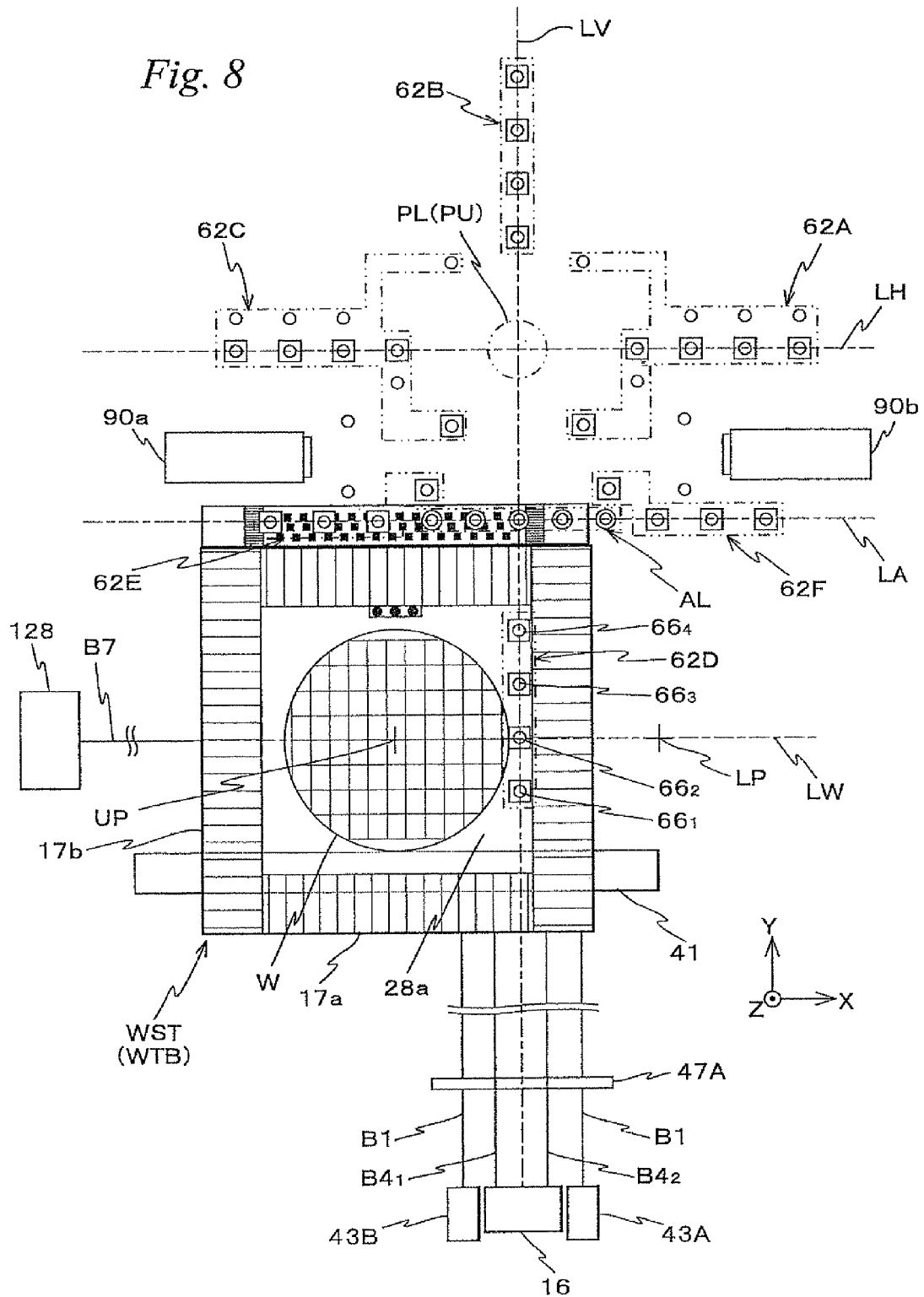
FIG. 8 is a view showing a first waiting position (unloading position) of the wafer stage.
Figure 9:
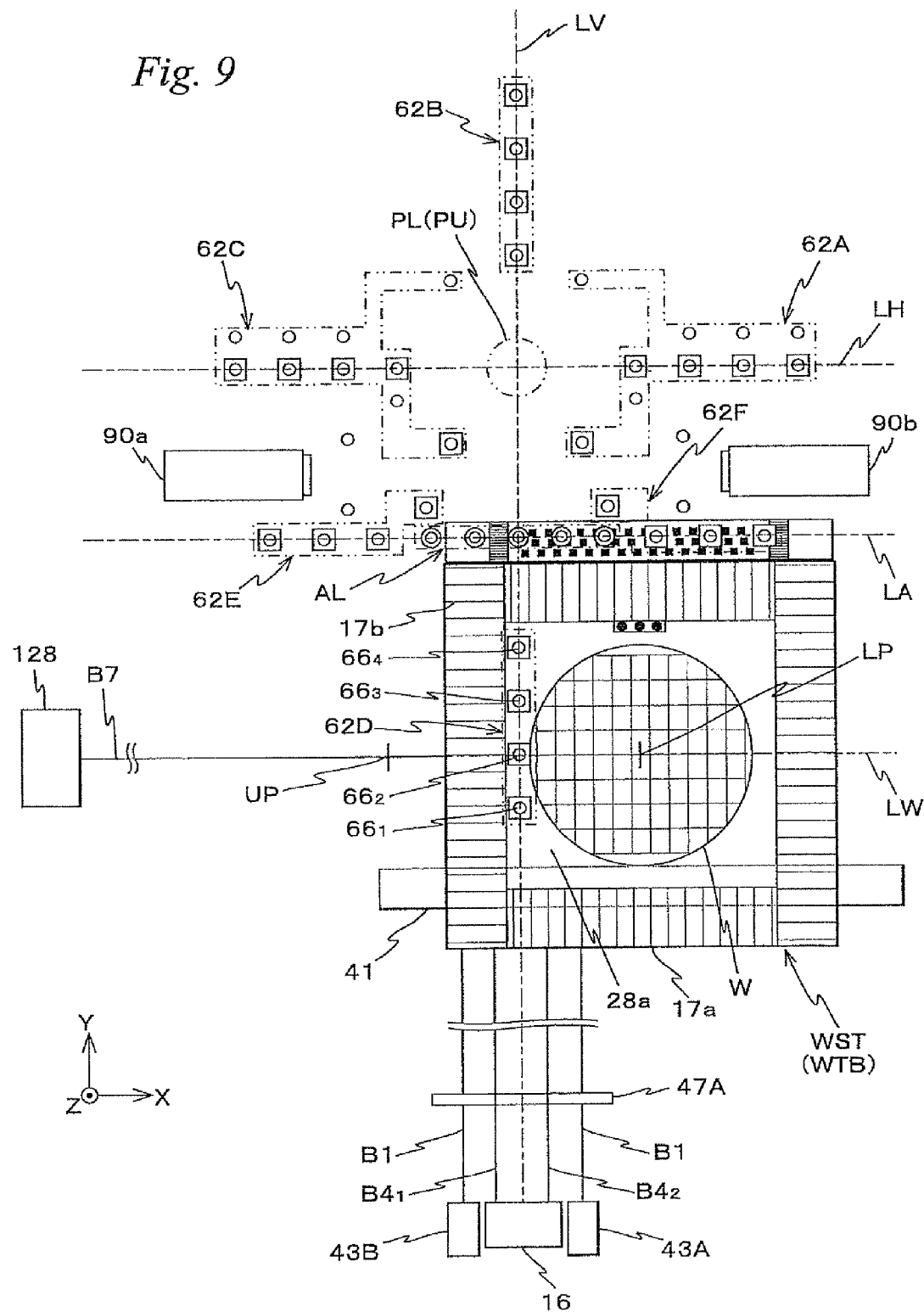
FIG. 9 is a view showing a second waiting position (unloading position) of the wafer stage.

More specifically, when wafer stage WST is located at unloading position UP shown in FIG. 8, wafer W is unloaded, and when wafer stage WST moves to loading position LP shown in FIG. 9, a new wafer W is loaded on wafer table WTB. In the vicinity of unloading position UP and loading position LP, the position of wafer stage WST in six degrees of freedom is controlled based on the measurement values of interferometer system 118. Further, at unloading position UP and loading position LP and in the movement path between them, all the encoder heads and Z heads do not face any of scales $39Y_1$, $39Y_2$, $39X_1$ and $39X_2$. More specifically, in an area including unloading position UP, loading position LP and the movement path between them, the irradiation points of measurement beams of all the encoder heads and the Z heads are located outside the scales.

Meanwhile, in exposure apparatus 100 of the embodiment, a sequence is employed, in which the measurement beams of the encoder heads and the Z heads are not irradiated to a same point on a scale for a predetermined period of time or more (i.e. the thermal stress does not exceed a permissible value), and as one of such a sequence, a method of withdrawing wafer stage WST to a "waiting position" is employed. Accordingly, in the case where wafer stage WST needs to be stopped for a predetermined period of time or more, unloading position UP and loading position LP are suitable positions serving as the waiting positions. Incidentally, in some cases, some of X heads $66_1$ to $66_4$ face(s) a part of the periphery of wafer W before exposure, but this causes no problem in particular because there is no possibility that the measurement beam(s) from the head(s) may expose the resist on the wafer W surface.

After the loading is completed, wafer stage WST is moved and a former process of baseline check of primary alignment system AL1, in which fiducial mark FM of measurement plate 30 is detected with primary alignment system AL1, is performed. Before and after the former process, re-setting (reset) of the origins of the encoder system and the interferometer system is performed.

After that, while measuring the position of wafer stage WST in directions of six degrees of freedom using the encoder system and the Z heads, alignment measurement in which alignment marks of a plurality of sample shot areas on wafer W are detected using alignment systems AL1 and $AL2_1$ to $AL2_4$ is executed, and in parallel with the alignment measurement, focus mapping (measurement of surface position (Z position) information of wafer W with the measurement values of Z heads $72a$ to $72d$ serving as references) is performed using the multipoint AF system ($90a$, $90b$). Then, during movement of wafer stage WST in the +Y direction for the alignment measurement and the focus mapping, a latter process of the baseline check of primary alignment AL1, in which a pair of alignment marks on reticle R are measured in a slit-scan-method using aerial image measuring instruments 45A and 45B, is performed when measurement plate 30 reaches a position directly under projection optical system PL.

Afterwards, the alignment measurement and the focus mapping are continued.

Then, when the alignment measurement and the focus mapping are completed, based on positional information of each shot area on the wafer that has been obtained from the result of the alignment measurement and the latest baseline of the alignment system, a plurality of shot areas on wafer W are exposed in a step-and-scan method, and patterns of the reticle are transferred. During the exposure operation, based on information obtained by the focus mapping, focus leveling control of wafer W is performed. Incidentally, the position of the wafer in the Z axis and θy directions during the exposure is controlled based on the measurement values of Z heads 74 and 76, whereas the position of the wafer in the θx direction is controlled based on the measurement values of Y interferometer 16.

Incidentally, baseline measurement of secondary alignment systems $AL2_1$ to $AL2_4$ is performed at an appropriate timing by simultaneously measuring reference marks M on FD bar 46 within the fields of the respective secondary alignment systems, using the four secondary alignment systems $AL2_1$ to $AL2_4$ in a state where Oz rotation of FD bar 46 (wafer stage WST) is adjusted, based on the measurement values of encoders $70E_2$ and $70F_2$ described earlier, in a similar method to the method disclosed in the pamphlet of International Publication No. 2007/097379.

A series of processes using wafer stage WST is performed as is described above, but in some cases, a situation arises where a series of processes using wafer stage WST is temporarily suspended and wafer stage WST has to be made to be in a standby state (an idle state), for some reason.

For example, in the case where, at the time of wafer exchange, a new wafer is not sent from a coater/developer that is, for example, inline connected to exposure apparatus 100, main controller 20 can make wafer stage WST stop and wait at loading position LP which is one of the waiting positions described earlier.

Meanwhile, in the case where it becomes necessary to make wafer stage WST wait for a short period of time when wafer stage WST is located at a position away from unloading position UP, loading position LP and the like, main controller 20 prevents the situation where measurement beams from the heads of the encoder and the Z heads continue to be irradiated to a same position of each scale on wafer stage WST from arising, by continuing to move wafer stage WST in a predetermined range. In this case, if there is a nearby waiting position other than unloading position UP and loading position LP, then main controller 20 can move wafer stage WST to the nearby waiting position instead of continuing to move wafer stage WST.

In this case, it could also be considered that emission of the measurement beams from the heads of the encoder and the Z heads is stopped, that is, these heads are turned OFF, but if the heads are turned OFF, then a long period of time is required until the emission state of the measurement beams is stabilized after the heads are turned ON again, therefore this is not preferable.

In view of such a point, in the embodiment, the irradiation amount of the measurement beams to each scale is controlled by continuing to move wafer stage WST or withdrawing wafer stage WST to the waiting position as is described above, thereby preventing distortion (deformation) of the scales due to irradiation heat of the measurement beams and measurement error of the encoder heads and the Z heads accompanying the distortion from occurring. In case of continuing to move wafer stage WST, main controller 20 can move wafer stage WST not only by continuous movement but also by step movement. In this specification, the wording "continuing to move" is used as a concept including such step movement as well.

Figure 10:
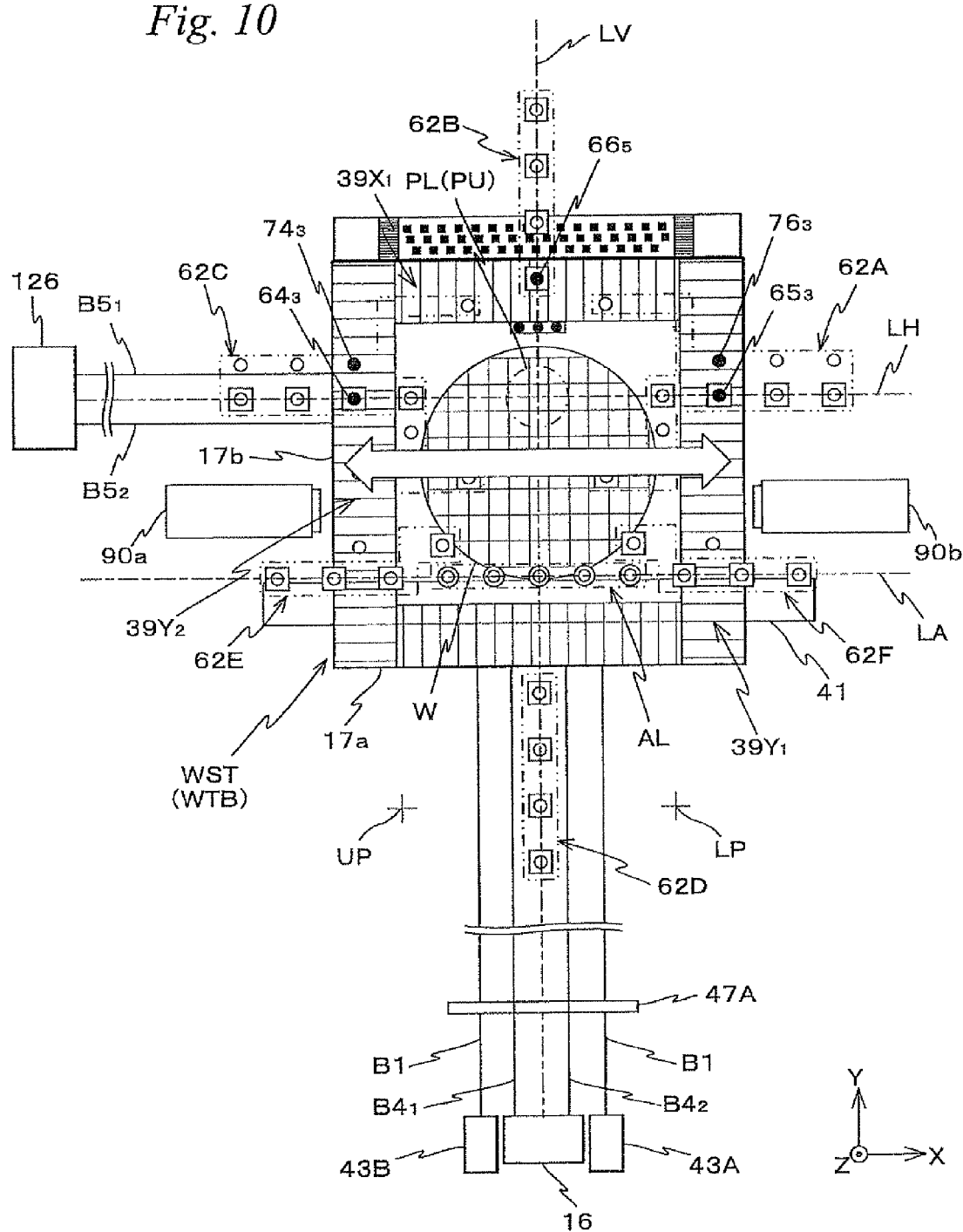
FIG. 10 is a view used to explain an example of a stage drive method for avoiding continuous irradiation of measurement beams from the encoder heads and the Z heads to a same position on a scale.

For example, main controller 20 drives wafer stage WST back and forth within a predetermined range as indicated by a two-headed outlined arrow in FIG. 10. In this case, main controller 20 sets the drive range (back-and-forth movement distance) and the driving speed of wafer stage WST so that the irradiation amount of the measurement beams is restrained to a level at which the thermal stress capable of distorting the scales is not accumulated, in accordance with the generation amount and the diffusion amount of heat generated accompanying the irradiation of the measurement beams. Incidentally, the case is illustrated as an example in FIG. 10 where a direction in which wafer stage WST is driven back and forth is the X-axis direction, but the direction in which wafer stage WST is driven back and forth can be arbitrarily set.

Figure 11:
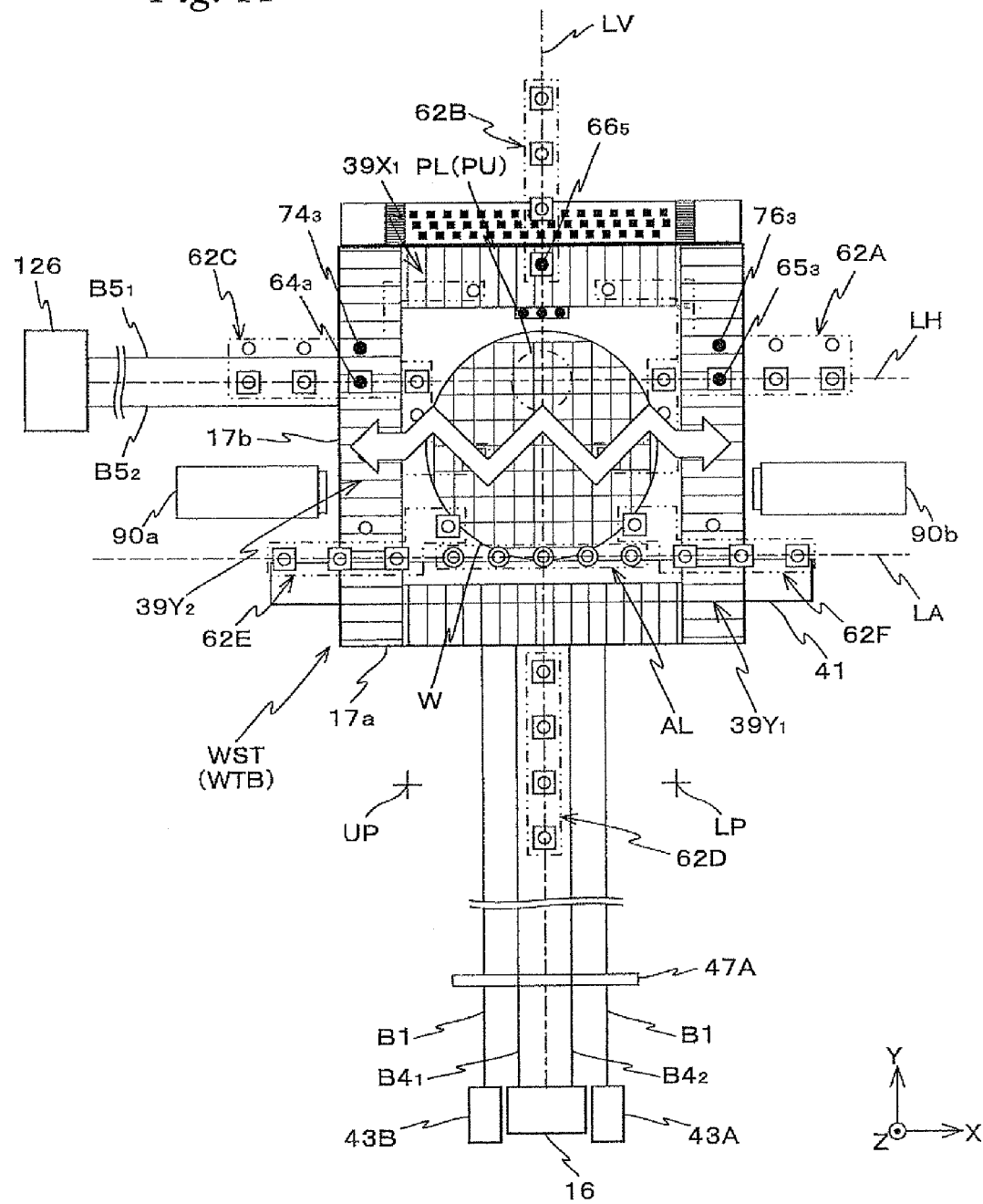
FIG. 11 is a view used to explain another example of a stage drive method for avoiding continuous irradiation of measurement beams from the encoder heads and the Z heads to a same position on a scale.
Figure 12:
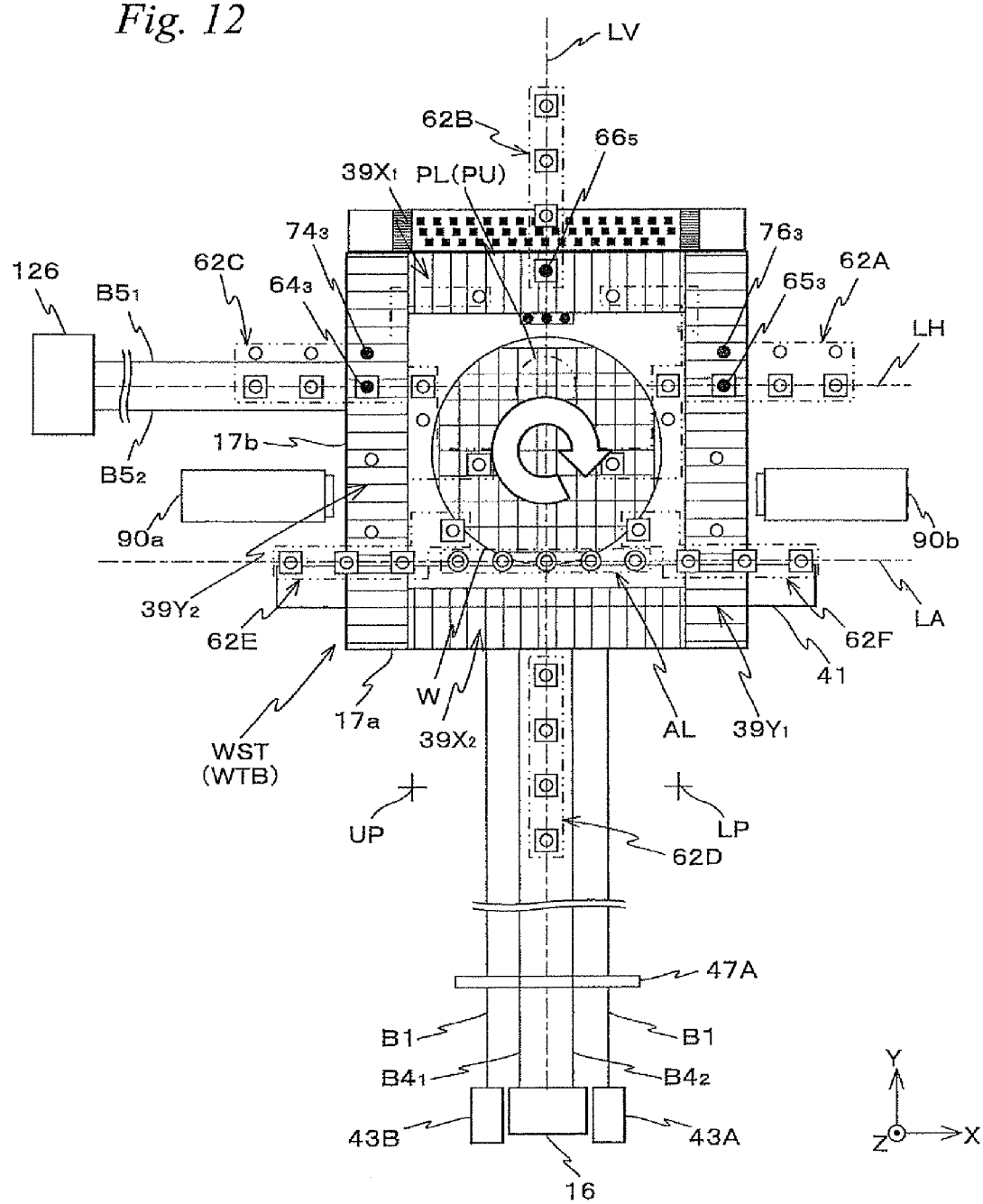
Figure 13:
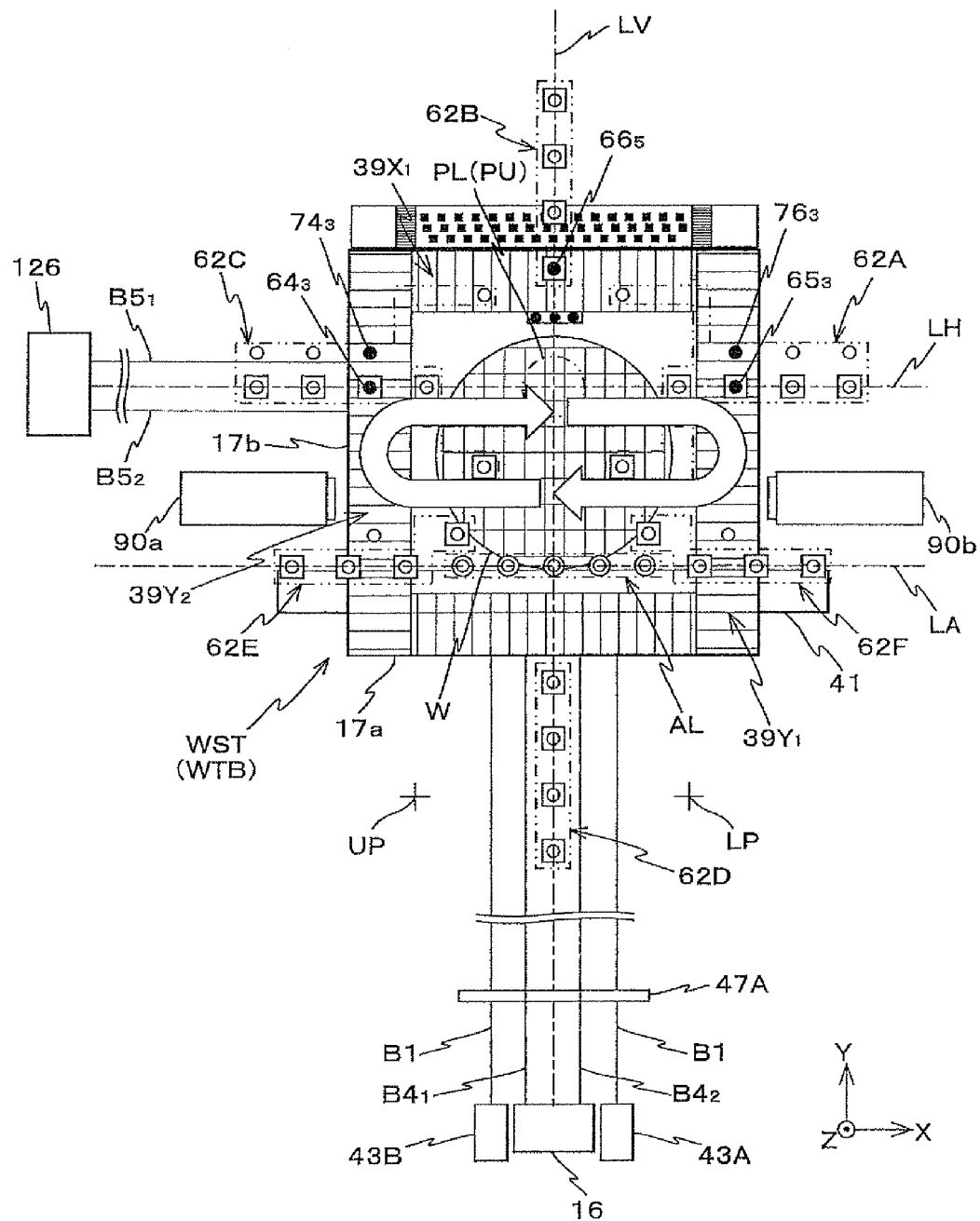
FIG. 13 is a view used to explain still another example of a stage drive method for avoiding continuous irradiation of measurement beams from the encoder heads and the Z heads to a same position on a scale.

Alternatively, main controller 20 can drive wafer stage WST back and forth along a zigzag path within a predetermined range as indicated by a two-headed outlined arrow in FIG. 11, or can drive and rotate wafer stage WST with a stop position serving as the center within a predetermined range as indicated by an outlined arrow in FIG. 12, or can perform go-around drive of wafer stage WST within a predetermined range as indicated by outlined arrows in FIG. 13. Further, main controller 20 can combine these drive methods. In these cases as well, main controller 20 sets the drive range and the driving speed of wafer stage WST so that the irradiation amount of the measurement beams is restrained to a level at which the thermal stress capable of distorting the scales is not accumulated, in accordance with the generation amount and the diffusion amount of heat generated accompanying the irradiation of the measurement beams. The point is that as far as the heat capable of distorting the scales at an unignorable level is not accumulated, the drive range, drive path, and driving speed of wafer stage WST can be arbitrarily set. Incidentally, a configuration can also be employed with which an operator can set the drive range, drive path, and driving speed of wafer stage WST described above.

Incidentally, the method of continuing to move wafer stage WST is the means to restrain the irradiation amount of the measurement beams to a same position on a scale, and therefore it is preferable that such a method is used only during idling of exposure apparatus 100 for a short period of time and wafer stage WST is withdrawn to the waiting position described previously during the idling for a long period of time. Further, in the examples shown in FIGS. 10 to 13, some heads face the upper surface of wafer table WTB (wafer W or the periphery thereof) besides the encoder heads and the Z heads that face the corresponding scales described above. Therefore, by using together a method of controlling irradiation of the measurement beams, main controller 20 can stop irradiation of the measurement beams from the heads that do not face the corresponding scales or can make such measurement beams be intermittently irradiated. Or, main controller 20 can decrease the intensity of the measurement beams of such heads and make the measurement beams be irradiated.

By avoiding the thermal deformation of the scales according to the method above, measurement accuracy of encoder system 150 (and surface position measuring system 180) can be secured.

As is described in detail above, in exposure apparatus 100 of the embodiment, encoder heads 64 to 68 and Z heads 72, 74 and 76 are installed to measure the position of wafer stage WST. The measurement beams emitted from these heads are irradiated to scales $39X_1$, $39X_2$, $39Y_1$ $_{and\ 39Y2}$ arranged on the upper surface of wafer stage WST. Therefore, by driving wafer stage WST using stage drive system 124, main controller 20 adjusts the irradiation amount of the measurement beams emitted from encoder heads 64 to 68 and Z heads 72, 74 and 76 onto scales $39X_1$, $39X_2$, $39Y_1$ and $39Y_2$. For example, during the idling of exposure apparatus 100, as is described above, main controller 20 continues to move wafer stage WST, or withdraws wafer stage WST to an area with which the measurement beams are not irradiated to scales $39X_1$, $39X_2$, $39Y_1$ and $39Y_2$, thereby avoiding continuous irradiation of the measurement beams onto scales $39X_1$, $39X_2$, $39Y_1$ and $39Y_2$. Therefore, the irradiation heat given to the scales is adjusted, and the stress (thermal stress) generated by the heat and/or distortion of the scales due to thermal expansion and the like can be suppressed. Accordingly, it becomes possible to maintain the high position measurement precision of encoder heads 64 to 68 (and Z heads 72, 74 and 76), and secure the drive accuracy of wafer stage WST.

Figure 14A:
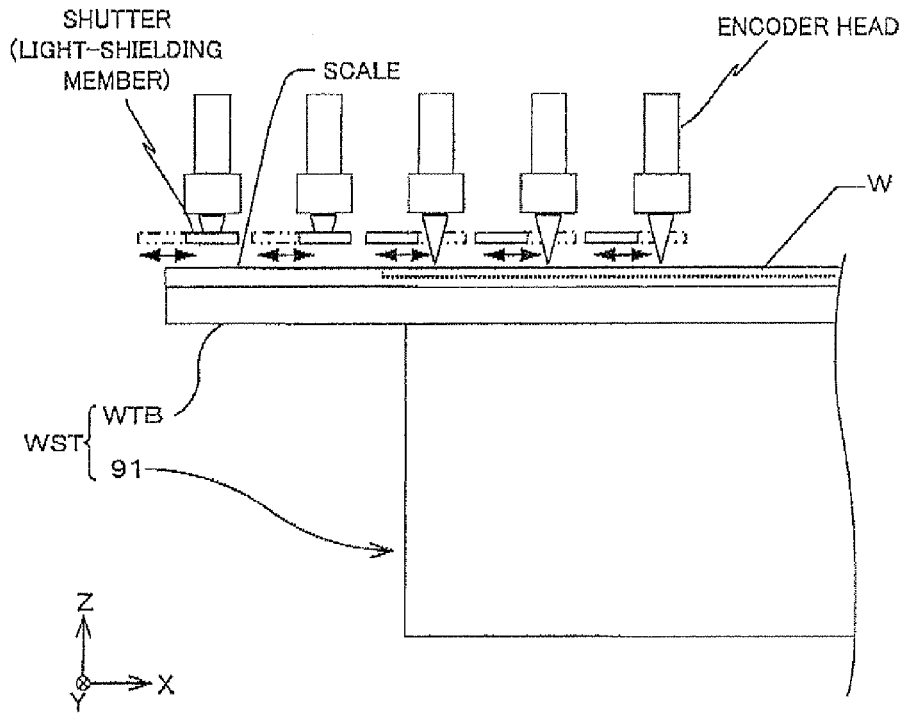
FIGS. 14A and 14B are side views showing an arrangement of a shutter and a cover with respect to the wafer stage.
Figure 14B:
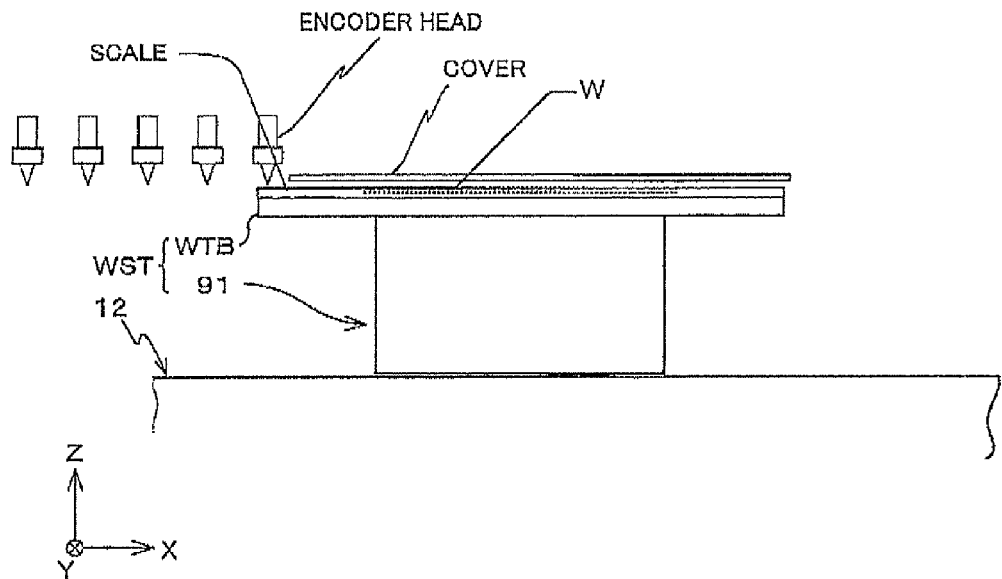

Incidentally, in the embodiment, in order to adjust the irradiation amount of the measurement beams irradiated from the encoder heads (and the Z heads) to the scales, methods "a" and "b" as follows can also be employed.

a. Main controller 20 can determine the minimum speed and the like in the continuous movement or the longest stay time and/or the step distance in the step movement, from the intensity of the measurement beams of the encoder heads so that the thermal stress, the deformation quantity (and distortion) of the scales and the like described above do not exceed the permissible values. As a matter of course, it is also possible that main controller 20 simply moves wafer stage WST without taking the intensity into consideration.

b. Further, main controller 20 can start the above-described sequence (such as stage movement and withdrawal to the waiting position) with a time management by a timer. Or, in the case where main controller 20 knows the time in advance in an exposure sequence, the above-described sequence can be automatically started without performing the time management, or the above-described sequence can only be started in the case where error occurs.

c. Further, in the embodiment, in order to adjust the irradiation amount of the measurement beams irradiated from the encoder heads (and the Z heads) to the scales, the intensity of the measurement beams can be decreased, or the measurement beams are cut off with methods such as "c1" and "c2" below, or these methods can be executed in combination with at least one of the methods in the above "a" and "b".

c1. In order to reduce the intensity of the measurement beams, for example, the light source of the encoder can be controlled or a neutral density filter can be inserted in the light-transmitting system.

c2. Further, in order to cut off the measurement beams, a shutter can be placed near an emitting section of the light-transmitting system or the head, or wafer stage WST can be moved to a predetermined position at which a cover (eaves) to cover the scale is installed, as illustrated in FIGS. 14A and 14B. In the latter case, the predetermined position can be set at a position with which at least one measurement beam is irradiated to the scale. Further, the cover does not have to cover the entire surface of the scale but the cover may only cut off the measurement beam of the head that faces the scale.

Incidentally, in the embodiment above, as the measurement beams that can distort the scales, the measurement beams emitted from the encoder heads and the Z heads have been mainly considered. However, the measurement beams of alignment systems AL1 and AL$2_1$ to AL$2_4$ and the multipoint AF system (90*a*, 90*b*) can also distort the scales similarly. Therefore, in the embodiment above, it is preferable that main controller 20 also adjusts the irradiation amount of these measurement beams to the scales and restrains the distortion of the scales due to the stress generated by the heat. The irradiation adjusting method in "a", "b" or "c" ("c1" and "c2") described above can be applied to such a case as well.

Incidentally, in the embodiment above, main controller 20 is to withdraw wafer stage WST to the waiting position at the error occurring time (abnormal time) such as when a new wafer is not sent to. However, not only at the abnormal time such as error occurrence, but also during the normal exposure sequence (such as at the time when an operation that does not use wafer stage WST is performed, or the period when such an operation is performed), the withdrawal or movement of wafer stage WST can be performed.

Incidentally, the configurations of the respective measurement devices such as the encoder system described in the embodiment above are merely examples, and the present invention is not limited thereto as a matter of course. For example, in the embodiment above, the position of wafer stage WST in one of the X-axis and Y-axis directions is to be measured with each head of the encoder system, but this is not intended to be limiting, and the encoder heads can be heads that can measure the position in one of the X-axis and Y-axis directions and the position in the Z-axis direction.

Further, the arrangements of the encoder heads and the Z heads described in the embodiment above are examples, and the arrangements of the heads are not limited thereto. Further, in the embodiment above, stage device 50 is to be equipped with encoder system 150 (the encoder heads) and surface position measuring system 180 (the Z heads), but stage device 50 can be equipped with either one of them.

Further, for example, in the embodiment above, the case has been exemplified where the encoder system having the configuration, in which the grating sections (the Y scales, and the X scales) are arranged on the wafer table (wafer stage) and so as to correspond to the grating sections, the X heads and Y heads are placed external to the wafer stage, is employed, but this is not intended to be limiting, and as is disclosed in, for example, U.S. Patent Application Publication No. 2006/0227309 and the like, an encoder system having a configuration (hereinafter, referred to as a table head method, for the sake of convenience), in which the encoder heads are arranged on the wafer stage and so as to correspond to the heads, the grating sections (e.g. two-dimensional gratings or one-dimensional grating sections that are placed two-dimensionally) are placed external to the wafer stage, can be employed. In this case, the Z heads can also be arranged on the wafer stage and the surface of their grating sections can be used as reflection surfaces to which the measurement beams of the Z heads are irradiated.

Further, also in the case of employing the encoder system by the table head method, the encoder heads can be heads that can measure the position in one of the X-axis and Y-axis directions and the position in the Z-axis direction.

Further, also in the case of employing the encoder system by the table head method, the embodiment above and its modified examples including the irradiation adjusting method of "a", "b" or "c" ("c1" and "c2") described previously can be applied. Further, in the case of employing the encoder system by the table head method, the wafer stage can be stopped at a position with which at least one head faces the grating section (a ceiling scale) external to the wafer stage, and in such a case, for example, such a position is determined so that the measurement beam from the head on the wafer stage in a standby state is irradiated to a part of the ceiling scale to which the measurement beam from the head is not irradiated even if the wafer stage is moved within a movement range of the exposure sequence. Further, the part of the ceiling scale is an area used in the exposure sequence and therefore it is preferable that such a position is apart from the used area, at a distance with which the thermal stress and the deformation do not affect the used area.

Further, in the embodiment above, the case has been described where the present invention is applied to a dry-type exposure apparatus that performs exposure of wafer W without liquid (water), but this is not intended to be limiting, and the present invention can also be applied to an exposure apparatus in which a liquid immersion space including an optical path of an illumination light is formed between a projection optical system and a plate and the plate is exposed with the illumination light via the projection optical system and liquid in the liquid immersion space, as is disclosed in, for example, the pamphlet of International Publication No. 99/49504, European Patent Application publication No. 1 420 298, the pamphlet of International Publication No. 2004/055803, Kokai (Japanese Unexamined Patent Application Publication) No. 2004-289126 (the corresponding U.S. Pat. No. 6,952,253) and the like. For example, in the case where the exposure apparatus of the embodiment above is a liquid immersion exposure apparatus, the wafer stage can be withdrawn to the waiting position described earlier also during cleaning of nozzles or the like.

Further, in the embodiment above, the case has been described where the present invention is applied to a scanning exposure apparatus by a step-and-scan method or the like, but this is not intended to be limiting, and the present invention can also be applied to a static exposure apparatus such as a stepper. Even with the stepper or the like, the similar effects can be obtained because the position of a stage on which an object that is subject to exposure is mounted can be measured using an encoder in a similar manner to the manner in the embodiment above. Further, the present invention can also be applied to a reduction projection exposure apparatus by a step-and-stitch method that synthesizes a shot area and a shot area, an exposure apparatus by a proximity method, a mirror projection aligner, or the like. Moreover, the present invention can also be applied to a multi-stage type exposure apparatus equipped with a plurality of wafer stages, as is disclosed in, for example, U.S. Pat. Nos. 6,590,634, 5,969,441, the U.S. Pat. No. 6,208,407, and the like.

For example, in a two-stage-type exposure apparatus equipped with two wafer stages, there are an exposure station where exposure of a wafer is performed and a measurement station where alignment of a wafer or the like is performed, and the embodiment above and its modified examples can be applied in the exposure station and can be similarly applied in the measurement station as well. In this case, the embodiment above and its modified examples can be applied, even if such an exposure apparatus has a configuration in which position measurement by the encoder system (either of the type of the embodiment above or the table head method can be employed) is performed in the measurement station, or a configuration in which the position measurement is performed by other devices than the encoder system. This is because in the latter case, an alignment system and the AF system are placed and the embodiment above and its modified examples are effective as measures to be taken for irradiation of the measurement beams from these systems.

Further, the present invention can also be applied to an exposure apparatus that is equipped with a measurement stage including measurement members (e.g. a fiducial mark, and/or a sensor, or the like), which is separate from the wafer stage, as is disclosed in, for example, the pamphlet of International Publication No. 2005/074014 (the corresponding U.S. Patent Application publication No. 2007/0127006) and the like. Also in the case of arranging the scales or the heads of the encoder system on the measurement stage, it is preferable to perform various controls that include the irradiation adjustment similar to the embodiment above and its modified examples.

Further, the magnification of the projection optical system in the exposure apparatus in the embodiment above is not only a reduction system, but also can be either an equal magnifying system or a magnifying system, and projection optical system PL is not only a dioptric system, but also can be either a catoptric system or a catadioptric system, and in addition, the projected image can be either an inverted image or an upright image. Moreover, the illumination area and the exposure area described earlier are to have a rectangular shape, but the shape is not limited thereto, and can also be circular arc, trapezoidal, parallelogram or the like.

Incidentally, the light source of the exposure apparatus in the embodiment above is not limited to the ArF excimer laser, but a pulsed laser light source such as a KrF excimer laser (output wavelength: 248 nm), an $F_2$ laser (output wavelength: 157 nm), an $Ar_2$ laser (output wavelength: 126 nm) or a $Kr_2$ laser (output wavelength: 146 nm), or an extra-high pressure mercury lamp that generates an emission line such as a g-line (wavelength: 436 nm) or an i-line (wavelength: 365 nm) can also be used. Further, a harmonic wave generating device of a YAG laser or the like can also be used. Besides the forgoing light sources, as is disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

Further, in the embodiment above, illumination light IL of the exposure apparatus is not limited to the light having a wavelength more than or equal to 100 nm, and it is needless to say that the light having a wavelength less than 100 nm can be used. For example, in recent years, in order to expose a pattern less than or equal to 70 nm, an EUV (Extreme Ultraviolet) exposure apparatus that makes an SOR or a plasma laser as a light source generate an EUV light in a soft X-ray range (e.g. a wavelength range from 5 to 15 nm), and uses a total reflection reduction optical system designed under the exposure wavelength (e.g. 13.5 nm) and the reflective mask has been developed. In the EUV exposure apparatus, the arrangement in which scanning exposure is performed by synchronously scanning a mask and a wafer using a circular arc illumination can be considered, and therefore, the present invention can also be suitably applied to such an exposure apparatus. In addition, the present invention can also be applied to an exposure apparatus that uses charged particle beams such as an electron beam or an ion beam.

Further, in the embodiment above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (a spatial light modulator) or the like) on which a light-transmitting pattern, a reflection pattern, or an emission pattern is formed according to electronic data of the pattern that is to be exposed can also be used.

Further, the present invention can also be applied to an exposure apparatus (a lithography system) that forms line-and-space patterns on a wafer, for example, by forming interference fringes on a wafer.

Moreover, the present invention can also be applied to an exposure apparatus that synthesizes two reticle patterns on a wafer via a projection optical system and almost simultaneously performs double exposure of one shot area on the wafer by one scanning exposure, as is disclosed in, for example, U.S. Pat. No. 6,611,316.

Further, an apparatus that forms a pattern on an object is not limited to the exposure apparatus (the lithography system) described earlier, and for example, the present invention can also be applied to an apparatus that forms a pattern on an object by an ink-jet method.

Incidentally, an object on which a pattern should be formed (an object subject to exposure to which an energy beam is irradiated) in the embodiment above is not limited to a wafer, but can be other objects such as a glass plate, a ceramic substrate, a film member, or a mask blank.

The use of the exposure apparatus is not limited to the exposure apparatus used for manufacturing semiconductor devices, but the present invention can be widely applied also to, for example, an exposure apparatus for manufacturing liquid crystal display devices which transfers a liquid crystal display device pattern onto a square-shaped glass plate, and to an exposure apparatus for manufacturing organic ELs, thin-film magnetic heads, imaging devices (such as CCDs), micromachines, DNA chips or the like. Further, the present invention can also be applied to an exposure apparatus that transfers a circuit pattern onto a glass substrate or a silicon wafer not only when producing microdevices such as semiconductor devices, but also when producing a reticle or a mask used in an exposure apparatus such as a light exposure apparatus, an EUV exposure apparatus, an X-ray exposure apparatus, and an electron beam exposure apparatus.

Incidentally, the above disclosures of the various publications, the pamphlets of the International Publications, and the U.S. Patent Application Publications descriptions, and the U.S. Patents descriptions that are cited in the description above and related to exposure apparatuses and the like are each incorporated herein by reference.

Electron devices such as semiconductor devices are manufactured through the following steps: a step where the function/performance design of a device is performed; a step where a reticle based on the design step is manufactured; a step where a wafer is manufactured using silicon materials; a lithography step where a pattern of the reticle is transferred onto the wafer with the exposure apparatus (the pattern formation apparatus) of the embodiment described earlier; a development step where the exposed wafer is developed; an etching step where an exposed member of an area other than the area where resist remains is removed by etching; a resist removing step where the resist that is no longer necessary when the etching is completed is removed; a device assembly step (including a dicing process, a bonding process, and a packaging process); an inspection step; and the like. In this case, in the lithography step, the exposure method described earlier is executed using the exposure apparatus of the embodiment above and device patterns are formed on the wafer, and therefore, highly-integrated devices can be manufactured with high productivity.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A movable body drive method of driving a movable body within a predetermined plane, the method comprising:
   a process of driving the movable body based on a result obtained by measuring a position of the movable body using a position measuring system that comprises a head that irradiates a measurement surface with a measurement beam, the measurement surface being installed on one of the movable body and an external of the movable body, and the head being installed on the other of the movable body and the external of the movable body; and
   a process of adjusting an irradiation amount of the measurement beam onto the measurement surface so that an accumulated amount of heat on the measurement surface does not exceed a predetermined level.

2. The movable body drive method according to claim 1, wherein
   in the process of adjusting, the irradiation amount of the measurement beam onto the measurement surface is adjusted by driving the movable body.

3. The movable body drive method according to claim 2, wherein
   in the process of adjusting, the movable body continues to be moved within a predetermined range.

4. The movable body drive method according to claim 2, wherein
   in the process of adjusting, the movable body is driven at a speed with which an amount of the measurement beam that is absorbed by the measurement surface does not exceed a constant amount.

5. The movable body drive method according to claim 4, wherein
   the constant amount is set based on at least one of a thermal stress and a deformation quantity at the measurement surface that are generated due to the measurement beam being absorbed.

6. The movable body drive method according to claim 1, wherein
   in the process of adjusting, the movable body is withdrawn to an area with which an irradiation point of the measurement beam is located outside the measurement surface.

7. The movable body drive method according to claim 1, wherein
   in the process of adjusting, the measurement beam is intermittently irradiated from a head that faces the measurement surface.

8. The movable body drive method according to claim 1, wherein
   in the process of adjusting, the measurement beam whose intensity is decreased is irradiated from a head that faces the measurement surface.

9. An exposure method of forming a pattern on a divided area on an object by irradiating the object with an energy beam, the method comprising:
   a process of driving a movable body that holds the object by using the movable body drive method according to claim 1, to form a pattern on the divided area.

10. A pattern formation method of forming a pattern on an object, the method comprising:
    a process of driving a movable body that holds the object by using the movable body drive method according to claim 1, to form a pattern on the object.

11. The pattern formation method according to claim 10, wherein
    the object has a sensitive layer, and
    the pattern is formed by irradiating the sensitive layer with an energy beam.

12. A device manufacturing method, comprising:
    a process of forming a pattern on an object by using the pattern formation method according to claim 10; and
    a process of applying processing to the object on which the pattern has been formed.

13. The exposure method according to claim 1, wherein
    in the process of adjusting, a light-shielding member is placed in an optical path of the measurement beam.

14. The exposure method according to claim 1, wherein
    in the process of adjusting, the movable body is moved to a predetermined position at which a cover to cover the measurement surface is installed.

15. The exposure method according to claim 14, wherein
    a plurality of the heads are provided, and
    the predetermined position is a position at which the measurement beam from at least one of the plurality of the heads is irradiated on the measurement surface.

16. The exposure method according to claim 14, wherein
    a plurality of the heads are provided, and
    the cover shields the measurement beam only to a head of the plurality of the heads that faces the measurement surface.

17. An exposure method of exposing an object with an energy beam, the method comprising:
    driving a movable body that can move within a predetermined plane while holding the object based on positional information of the movable body, the positional information being measured by using a position measuring system that has a measurement surface installed on one of the movable body and an external thereof, and a head installed on the other; and
    blocking a physical quantity that includes at least one of a thermal stress and a deformation quantity at the measurement surface from exceeding a permissible value due to irradiation of the measurement beam by adjusting an irradiation amount of the measurement beam onto the measurement surface.

18. The exposure method according to claim 17, wherein
    the measurement surface is substantially parallel to the predetermined plane and has a diffraction grating.

19. The exposure method according to claim 17, wherein
    for the blocking, the movable body is driven within the predetermined plane.

20. The exposure method according to claim 17, wherein
    for the blocking, the measurement surface is made to be out of an irradiation point of the measurement beam.

21. The exposure method according to claim 17, wherein
    for the blocking, a light-shielding member is placed in an optical path of the measurement beam, or intensity of the measurement beam is decreased.

22. The exposure method according to claim 17, wherein
    the blocking is performed during at least one of the time of abnormality in an exposure sequence of the object and a period when the movable body is not used 23. The exposure method according to claim 17, further comprising:
- measuring positional information of the object with another measurement device that is separate from the position measuring system; and
- blocking the physical quantity from exceeding a permissible value due to irradiation of a beam of the measurement device.

24. A device manufacturing method, comprising:
- exposing an object by using the exposure method according to claim 17; and
- developing the object that has been exposed.

25. The exposure method according to claim 18, wherein for the blocking, the movable body is moved to a predetermined position at which a cover to cover the diffraction grating is installed.

26. The exposure method according to claim 25, wherein a plurality of the heads are provided, and
- the predetermined position is a position at which the measurement beam from at least one of the plurality of the heads is irradiated on the diffraction grating.

27. The exposure method according to claim 25, wherein a plurality of the heads are provided, and
- the cover shields the measurement beam only to a head of the plurality of the heads that faces the diffraction grating.

28. The exposure method according to claim 25, wherein the cover covers a part of the diffraction grating.

29. A movable body drive apparatus that drives a movable body within a predetermined plane, the apparatus comprising:
- a position measuring system that measures a position of the movable body by using a head that irradiates a measurement surface with a measurement beam, the measurement surface being installed on one of the movable body and an external of the movable body, and the head being installed on the other of the movable body and the external of the movable body;
- a drive device that drives the movable body within the predetermined plane based on a measurement result of the position measuring system; and
- an adjustment device that adjusts an irradiation amount of the measurement beam onto the measurement surface so that an accumulated amount of heat on the measurement surface does not exceed a predetermined level.

30. The movable body drive apparatus according to claim 29, wherein
- the adjustment device continues to move the movable body within a predetermined range.

31. The movable body drive apparatus according to claim 29, wherein
- the adjustment device drives the movable body at a speed with which an amount of the measurement beam that is absorbed by the measurement surface does not exceed a constant amount.

32. The movable body drive apparatus according to claim 31, wherein
- the constant amount is set based on at least one of a thermal stress and a deformation quantity at the measurement surface that are generated due to the measurement beam being absorbed.

33. The movable body drive apparatus according to claim 29, wherein
- the adjustment device withdraws the movable body to an area with which an irradiation point of the measurement beam is located outside the measurement surface.

34. The movable body drive apparatus according to claim 29, wherein
- on the measurement surface, a diffraction grating having a periodic direction in a direction parallel to a first axis within the predetermined plane is formed, and
- the position measuring system includes an encoder system that measures a relative position in the direction parallel to the first axis of the measurement surface and the head that irradiates the measurement surface with the measurement beam.

35. The movable body drive apparatus according to claim 34, wherein
- on the measurement surface, another diffraction grating having a periodic direction in a direction parallel to a second axis that is orthogonal to the first axis within the predetermined plane is further formed, and
- the encoder system further measures a relative position in the direction parallel to the second axis of the measurement surface and the head.

36. The movable body drive apparatus according to claim 29, wherein
- the position measuring system includes a surface position measuring system that measures a position of the measurement surface in a direction orthogonal to the predetermine plane, at an irradiation point of the measurement beam.

37. The movable body drive apparatus according to claim 29, wherein
- the position measuring system includes a mark detecting system that detects a mark on the measurement surface by using the head.

38. An exposure apparatus that forms a pattern on a divided area on an object by irradiating the object with an energy beam, the apparatus comprising:
- the movable body drive apparatus according to claim 29 that drives a movable body that holds the object within a predetermined plane, to form a pattern on the divided area.

39. A pattern formation apparatus that forms a pattern on an object, the apparatus comprising:
- a movable body that can move while holding the object;
- a pattern generating device that forms a pattern on the object; and
- the movable body drive apparatus according to claim 29 that drives the movable body within a predetermined plane.

40. The pattern formation apparatus according to claim 39, wherein
- the object has a sensitive layer, and
- the pattern generating device forms the pattern by irradiating the sensitive layer with an energy beam.

41. An exposure apparatus that exposes an object with an energy beam, the apparatus comprising:
- a movable body that can move within a predetermined plane, while holding the object;
- a position measuring system that has a head and measures positional information of the movable body by irradiating a measurement surface with a measurement beam from the head and receiving a reflected light of the measurement beam, the measurement surface being installed on one of the movable body and an external of the movable body, and a head being installed on the other of the movable body and the external of the movable body;
- a drive system that drives the movable body based on the positional information; and a controller that blocks a physical quantity that includes at least one of a thermal stress and a deformation quantity at the measurement surface from exceeding a permissible value due to irradiation of the measurement beam by adjusting an irradiation amount of the measurement beam onto the measurement surface.

42. The exposure apparatus according to claim 41, wherein the measurement surface is substantially parallel to the predetermined plane and has a diffraction grating.

43. The exposure apparatus according to claim 41, wherein for the blocking, the controller drives the movable body within the predetermined plane via the drive system.

44. The exposure apparatus according to claim 41, wherein for the blocking, the controller makes the measurement surface be out of an irradiation point of the measurement beam.

45. The exposure apparatus according to claim 41, wherein for the blocking, the controller places a light-shielding member in an optical path of the measurement beam, or decreases intensity of the measurement beam.

46. The exposure apparatus according to claim 41, wherein the controller performs the blocking during at least one of the time of abnormality in an exposure sequence of the object and a period when the movable body is not used.

47. The exposure apparatus according to claim 41, further comprising:
another measurement device that measures positional information of the object and is separate from the position measuring system; wherein
the controller blocks the physical quantity from exceeding a permissible value due to irradiation of a beam of the measurement device.

48. A device manufacturing method, comprising:
exposing an object by using the exposure apparatus according to claim 41; and
developing the object that has been exposed.

* * * * *